(12) United States Patent
Chang et al.

(10) Patent No.: US 8,501,574 B2
(45) Date of Patent: Aug. 6, 2013

(54) RESISTIVE MEMORY DEVICE AND MANUFACTURING METHOD THEREOF AND OPERATING METHOD THEREOF

(75) Inventors: Kuo-Pin Chang, Yuanli Township, Miaoli County (TW); Hang-Ting Lue, Hsinchu (TW); Cheng-Hung Tsai, Toufen Town (TW)

(73) Assignee: Macronix International Co., Ltd., Hsinchu (TW)

( * ) Notice: Subject to any disclaimer, the term of this patent is extended or adjusted under 35 U.S.C. 154(b) by 533 days.

(21) Appl. No.: 12/574,938

(22) Filed: Oct. 7, 2009

(65) Prior Publication Data

US 2011/0080766 A1    Apr. 7, 2011

(51) Int. Cl.
*H01L 21/20*    (2006.01)

(52) U.S. Cl.
USPC ............. 438/382; 257/E21.004; 257/E21.158

(58) Field of Classification Search
USPC ........... 438/381, 382; 257/E21.004, E21.158
See application file for complete search history.

(56) References Cited

U.S. PATENT DOCUMENTS

| 2006/0110877 | A1 | 5/2006 | Park et al. |
| 2008/0220601 | A1 | 9/2008 | Kumar et al. |
| 2010/0032640 | A1* | 2/2010 | Xu .................................... 257/2 |
| 2010/0157653 | A1* | 6/2010 | Scheuerlein .................. 365/148 |
| 2010/0237346 | A1* | 9/2010 | Kanno et al. .................... 257/49 |

FOREIGN PATENT DOCUMENTS

| CN | 1790669 | 6/2006 |
| CN | 101262004 A | 9/2008 |

OTHER PUBLICATIONS

Chinese language office action dated Jul. 10, 2012.
English language translation of abstract of CN 1790669 (published Jun. 21, 2006).
English Abstract translation of CN101262004 (Published Sep. 10, 2008).
CN Office Action dated May 8, 2013.
TW Office Action dated May 30, 2013.

* cited by examiner

*Primary Examiner* — Julia Slutsker
(74) *Attorney, Agent, or Firm* — McClure, Qualey & Rodack, LLP

(57) ABSTRACT

A method of manufacturing resistive memory includes the steps: forming a first implanted stacked structure having a first impurity diffusion layer, a second impurity diffusion layer, and a third impurity diffusion layer in a substrate; etching at least the first implanted stacked structure to form a plurality of second implanted stacked structures, wherein the first impurity diffusion layers are first signal lines; forming a plurality of first insulating layers between the second implanted stacked structures; etching the second implanted stacked structures to form a plurality of third implanted stacked structures, wherein the first signal lines are not etched; forming a plurality of second insulating layers between the third implanted stacked structures; forming a plurality of memory material layers electrically coupled to the third impurity diffusion layers; and forming a plurality of second signal lines perpendicular to the first signal lines and electrically coupled to the memory material layers.

25 Claims, 32 Drawing Sheets

RESISTIVE MEMORY DEVICE AND MANUFACTURING METHOD THEREOF AND OPERATING METHOD THEREOF

BACKGROUND OF THE INVENTION

1. Field of the Invention

The invention relates in general to a memory device, and more particularly to a resistive memory device and a manufacturing method thereof and an operating method thereof.

2. Description of the Related Art

Among a variety of memory devices for storing data, the resistive memory has gotten more attention from the manufacturers because of its high scaling characteristics.

Conventionally, after a resistive memory is fabricated, the via holes or contact holes on the resistive memory is formed in the process of back end of line (BEOL) for connecting to other components. However, the design rule of the via holes or contact holes formed in BEOL is larger than that in the process of front end of line (FEOL) or middle end of line (MEOL). Thus, the via holes or contact holes formed in BEOL certainly have influence on the manufacture of resistive memory with small size.

SUMMARY OF THE INVENTION

It is therefore an object of the invention to provide a resistive memory device and a manufacturing method thereof and an operating method thereof which apply line-type pattern in the manufacturing process to form self-align openings and define the position of the memory cells, further enhancing the memory cell density greatly.

The invention achieves the above-identified object by providing a method of manufacturing a resistive memory which includes the following steps. First, a first implanted stacked structure having a first impurity diffusion layer, a second impurity diffusion layer, and a third impurity diffusion layer is formed in a substrate. Then, the first implanted stacked structure is etched to form a plurality of second implanted stacked structures, wherein the first impurity diffusion layers of the second implanted stacked structure are first signal lines. Next, a plurality of first insulating layers are formed between the second implanted stacked structures. Then, the second implanted stacked structures are etched to form a plurality of third implanted stacked structures that are arranged in the form of a matrix, wherein the first signal lines are not etched. Next, a plurality of second insulating layers are formed between the third implanted stacked structures. Then, a plurality of memory material layers are formed in accordance with the third implanted stacked structures and electrically coupled to the third impurity diffusion layers. After that, a plurality of second signal lines perpendicular to the first signal lines are formed and electrically coupled to the memory material layers.

The invention achieves the above-identified object by providing a resistive memory device which includes a base layer, a plurality of first signal lines, an insulating structure, a plurality of junction structures, a plurality of memory material layers, and a plurality of second signal lines. The first signal lines are disposed on the base layer. The insulating structure is disposed on the base layer and the first signal lines and has a plurality of openings arranged in the form of matrix. The junction structures are disposed within the openings and electrically coupled to the first signal lines, wherein each junction structure has two impurity layers stacked together. The memory material layers are disposed in accordance with the openings and electrically coupled to the junction structures. The second signal lines are disposed perpendicular to the first signal lines and electrically coupled to the memory material layers.

The invention achieves the above-identified object by further providing a method for operating a resistive memory device which comprises the following steps. First, a resistive memory device having tungsten silicide is provided. Next, a predetermined condition for driving the resistive memory device is provided, wherein the predetermined condition includes at least one of a predetermined voltage and a predetermined pulse width. Then, the resistive memory device is driven according to the predetermined condition for switching the memory device from off state to on state.

Other objects, features, and advantages of the invention will become apparent from the following detailed description of the preferred but non-limiting embodiments. The following description is made with reference to the accompanying drawings.

DETAILED DESCRIPTION OF THE INVENTION

A method of manufacturing resistive memory including the following steps is disclosed. The method includes the steps of: forming a first implanted stacked structure having a first impurity diffusion layer, a second impurity diffusion layer, and a third impurity diffusion layer in a substrate; etching at least the first implanted stacked structure to form a plurality of second implanted stacked structures, wherein the first impurity diffusion layers are first signal lines; forming a plurality of first insulating layers between the second implanted stacked structures; etching the second implanted stacked structures to form a plurality of third implanted stacked structures, wherein the first signal lines are not etched; forming a plurality of second insulating layers between the third implanted stacked structures; forming a plurality of memory material layers in accordance with the third implanted stacked structures and electrically coupled to the third impurity diffusion layers; and forming a plurality of second signal lines perpendicular to the first signal lines and electrically coupled to the memory material layers. The method of manufacturing resistive memory is further elaborated with detailed embodiments in the following.

Figure 1:
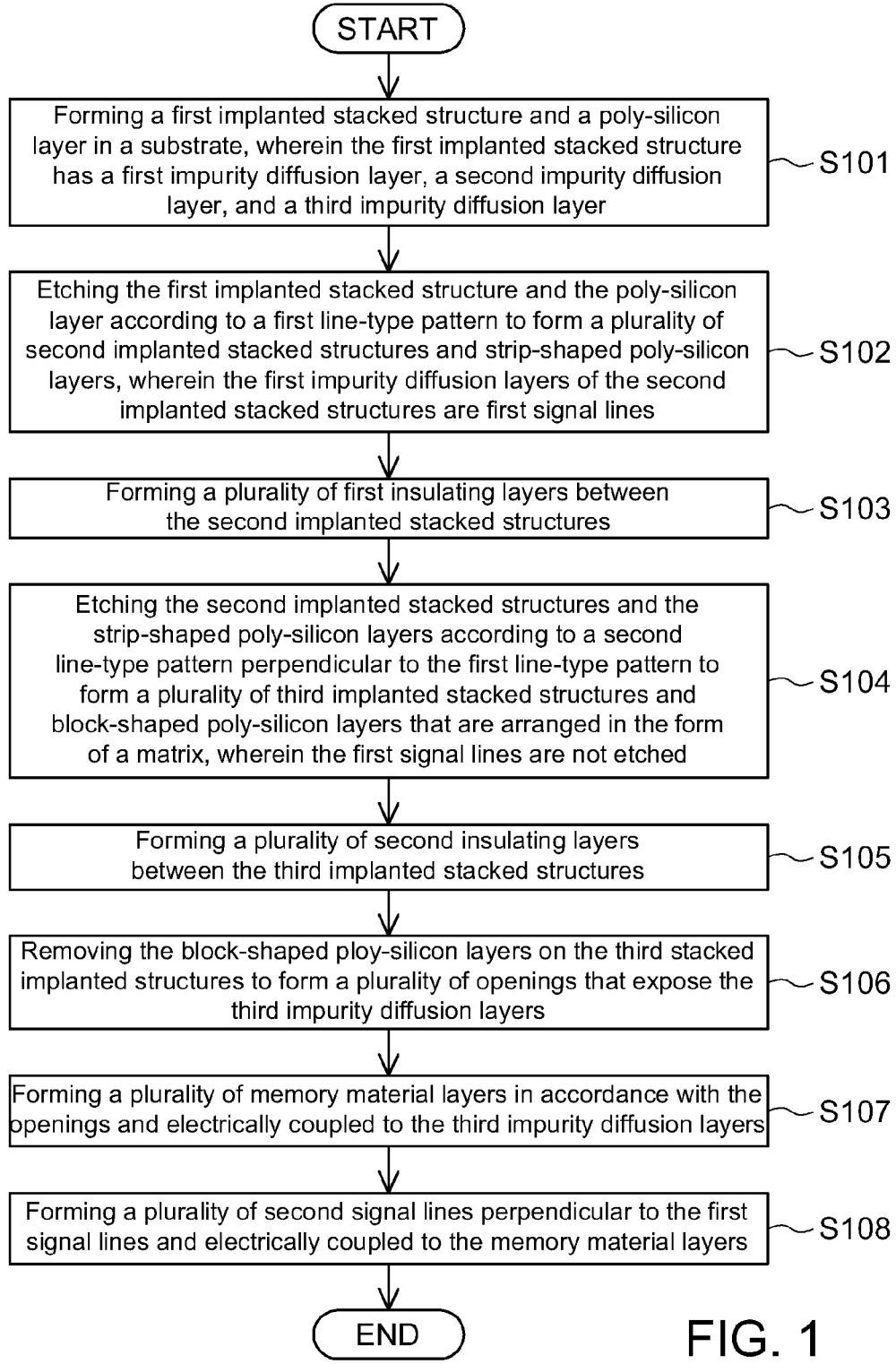
FIG. 1 is a diagram showing the flowchart of a manufacturing method of resistive memory device according to the first embodiment of the invention.

Refer to FIG. 1 to FIG. 15B. FIG. 1 is a diagram showing the flowchart of a manufacturing method of resistive memory device according to the first embodiment of the invention. FIGS. 2 to 15B are diagrams showing different steps in accordance with the method of FIG. 1. The manufacturing method of resistive memory device includes steps S101 to S108 that are elaborated in the following.

Figure 2:
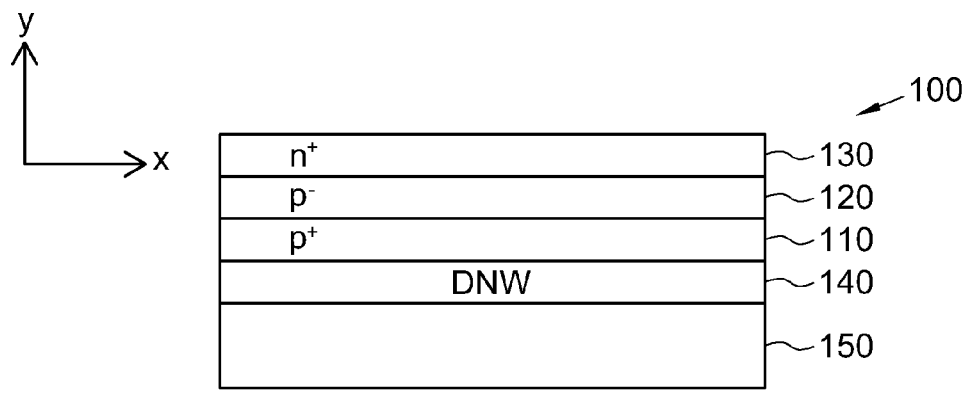
FIGS. 2 to 15B are diagrams showing different steps in accordance with the method of FIG. 1.

In step S101, a first implanted stacked structure and a poly-silicon layer are formed in a substrate, wherein the first implanted stacked structure has a first impurity diffusion layer, a second impurity diffusion layer and a third impurity diffusion layer. As shown in FIG. 2, by ion implantation, ionic impurities are implanted at different depths within a substrate 100 sequentially, so as to form a first impurity diffusion layer 110, a second impurity diffusion layer 120 and a third impurity diffusion layer 130. The impurities are conductive impurities, such as p-type impurity of boron (B) or aluminum (Al), and n-type impurity of phosphorus (P) or arsenic (As), etc. In the embodiment, the first impurity diffusion layer 110 is the deepest layer within the substrate 100, the third impurity diffusion layer 130 is the shallowest one, and the second impurity diffusion layer 120 is located between the first impurity diffusion layer 110 and the third impurity diffusion layer 130, wherein the implant depth of impurity is decided by the ion beam intensity. Preferably, a deep implanted layer 140 is formed within the substrate 100 prior to the impurity diffusion layers 110 to 130 for isolating the bottom side of the substrate 100 by separating the impurity diffusion layers 110 to 130 from a base layer 150.

The first impurity diffusion layer 110 is a $p^+$-type impurity layer or an $n^+$-type impurity layer, and the characteristics of the second impurity diffusion layer 120 and the third impurity diffusion layer 130 are determined according to that of the first impurity diffusion layer 110. For instance, as the first impurity diffusion layer 110 is a $p^+$-type impurity layer, the second impurity diffusion layer 120 is a $p^-$-type impurity layer, and the third impurity diffusion layer 130 is an $n^+$-type impurity layer, and the deep implant layer 140 is a deep n-well (DNW) layer. Or, as the first impurity diffusion layer 110 is an $n^+$-type impurity layer, the second impurity diffusion layer 120 should be an $n^-$-type impurity layer, and the third impurity diffusion layer 130 should be a $p^+$-type impurity layer.

Figure 3:
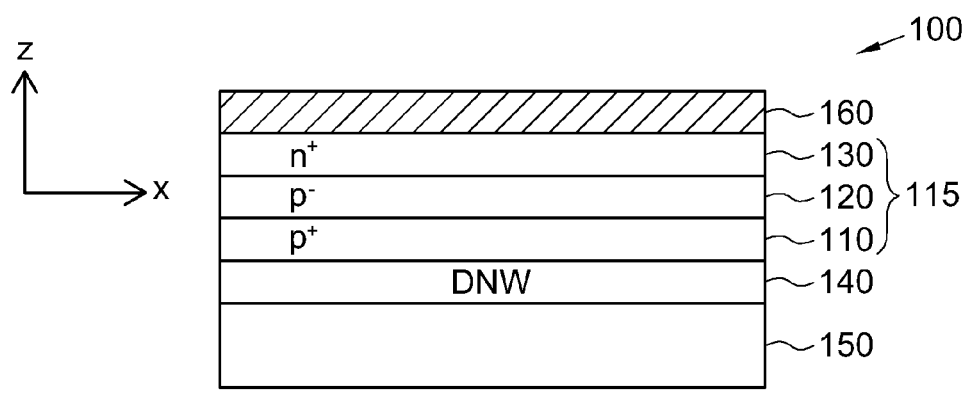

After formed each impurity diffusion layer, as shown in FIG. 3, a poly-silicon layer 160 is deposited on the third impurity diffusion layer 130. And, the poly-silicon layer 160 is processed by ion implantation so as to increase its conductivity. The manufacture of a first implanted stacked structure 115 and the poly-silicon layer 160 are herein completed.

Figure 4A:
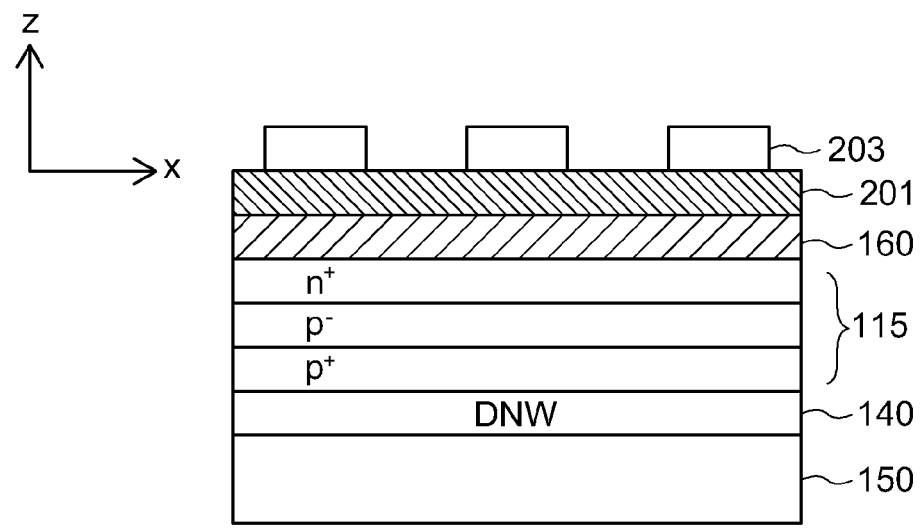
Figure 4B:
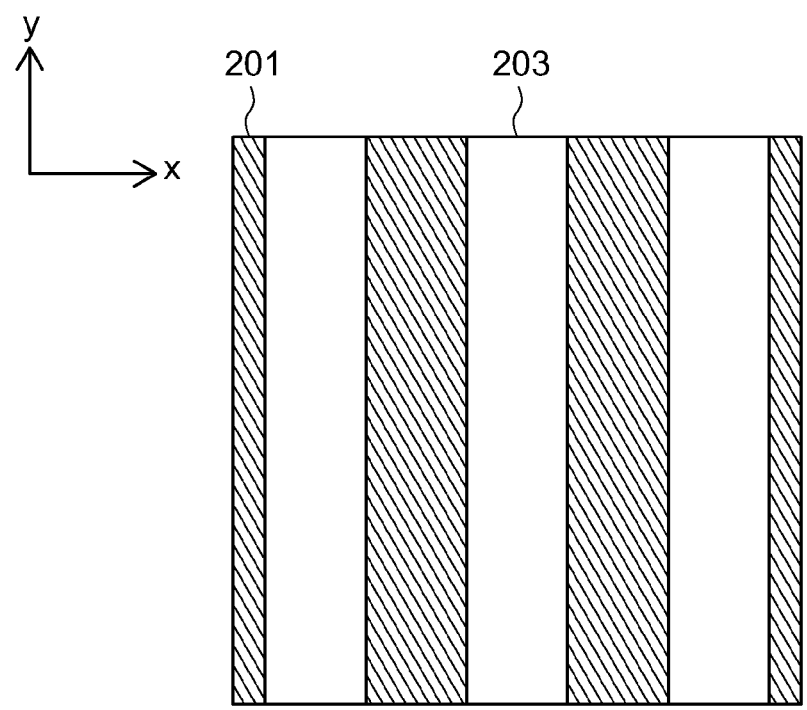
Figure 5A:
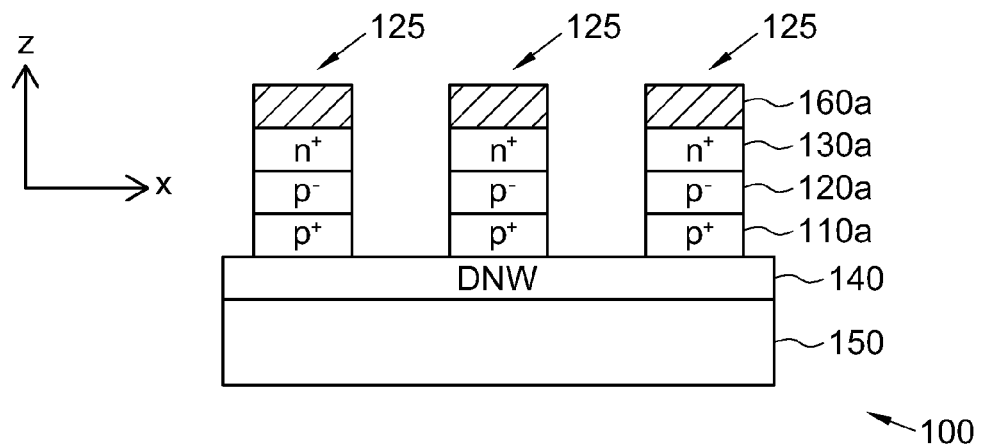
Figure 5B:
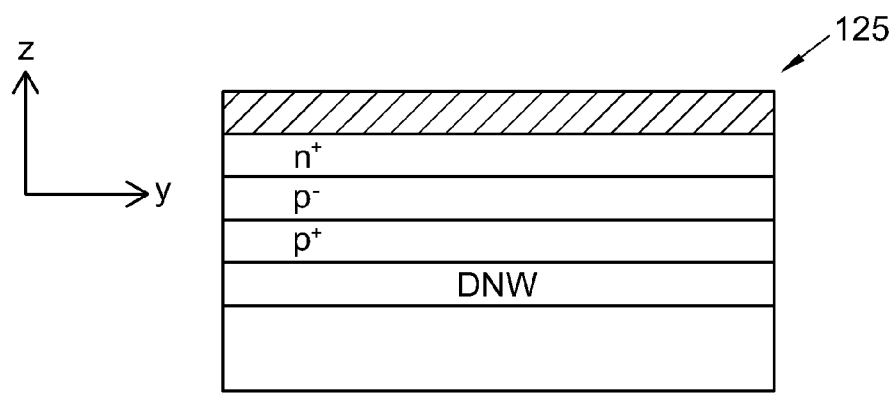

Then, in step S102, the first implanted stacked structure and the poly-silicon layer are etched according to a first line-type pattern to form a plurality of second implanted stacked structures and strip-shaped poly-silicon layers, wherein the first impurity diffusion layers of the second implanted stacked structures are first signal lines. Referring to FIGS. 4A and 4B, a hard mask material layer 201 is first formed on the first implanted stacked structure 115, and a photo-resist material layer (not shown) is formed on the hard mask material layer 201. Then, a patterned photo-resist layer 203 is formed from the photo-resist material layer. Next, the hard mask material layer 201 is etched to form a patterned hard mask having the first line-type pattern. The first line-type pattern has a plurality of parallel openings that extend along y direction, for example. Then, the patterned photo-resist layer is removed, and a part of the first implanted stacked structure 115 that is not covered by the patterned hard mask is etched. Afterwards, the patterned hard mask is removed, and a plurality of second implanted stacked structures 125 are formed, as shown in FIGS. 5A and 5B.

The second implanted stacked structures 125 are bar-shaped and parallel to each other along y direction. Each second implanted stacked structure 125 includes a first impurity diffusion layer 110a, a second impurity diffusion layer 120a and a third impurity diffusion layer 130a, and a strip-shaped poly-silicon layer 160a is disposed on the third impurity diffusion layer 130a, wherein the first impurity diffusion layer 110a is used as a first signal line. The step of etching the first implanted stacked structure 115 and the poly-silicon layer 160 to form the second implanted stacked structures 125 and the strip-shaped poly-silicon layers 160a can be incorporated with the process of double patterning lithography for increasing the density of memory cells.

Figure 6A:
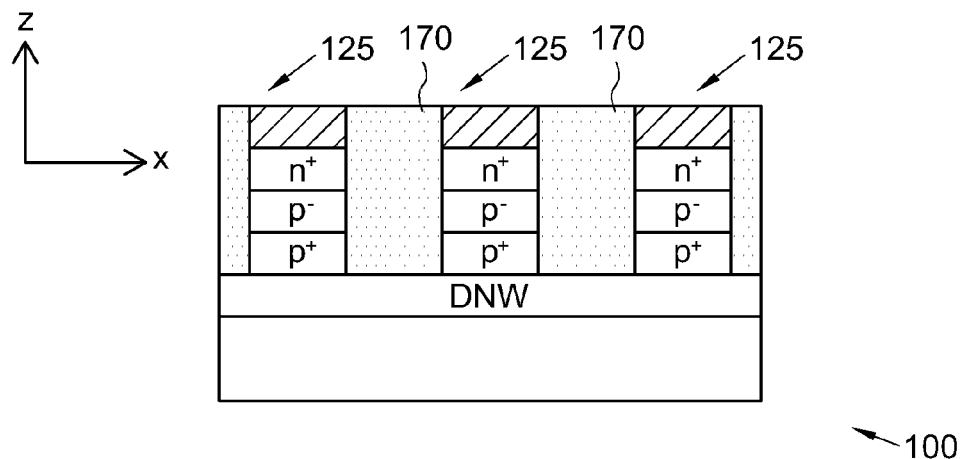
Figure 6B:
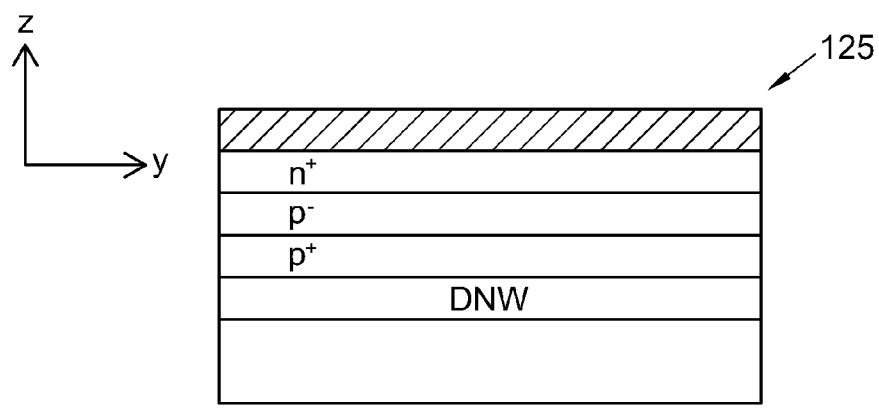

Next, in step S103, a plurality of first insulating layers are formed between the second implanted stacked structures. By tetraethyl orthosilicate (TEOS) process, an insulating material (not shown) is deposited on the substrate 100 and within a plurality of gaps between the second implanted stacked structures 125. Then, the insulating material is smoothed by, for example, chemical mechanical polishing (CMP) to form a plurality of first insulating layers 170, as shown in FIGS. 6A and 6B. The insulating material can be silicon oxide.

Figure 7A:
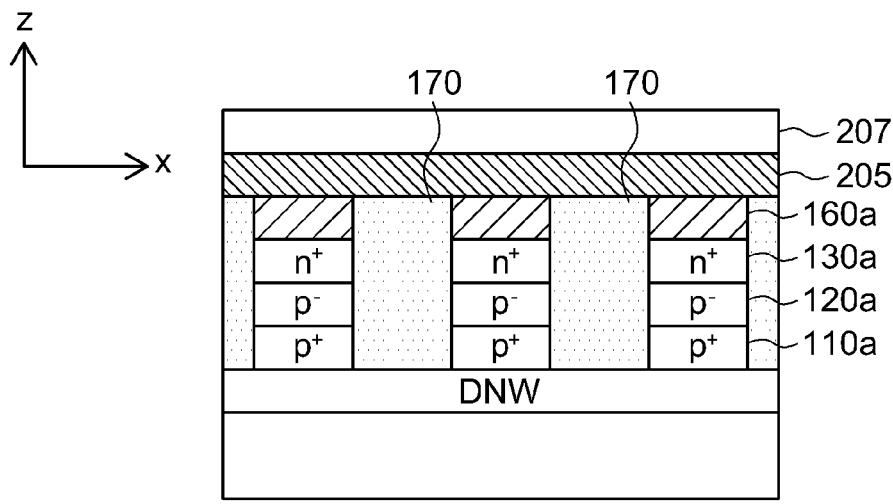
Figure 7B:
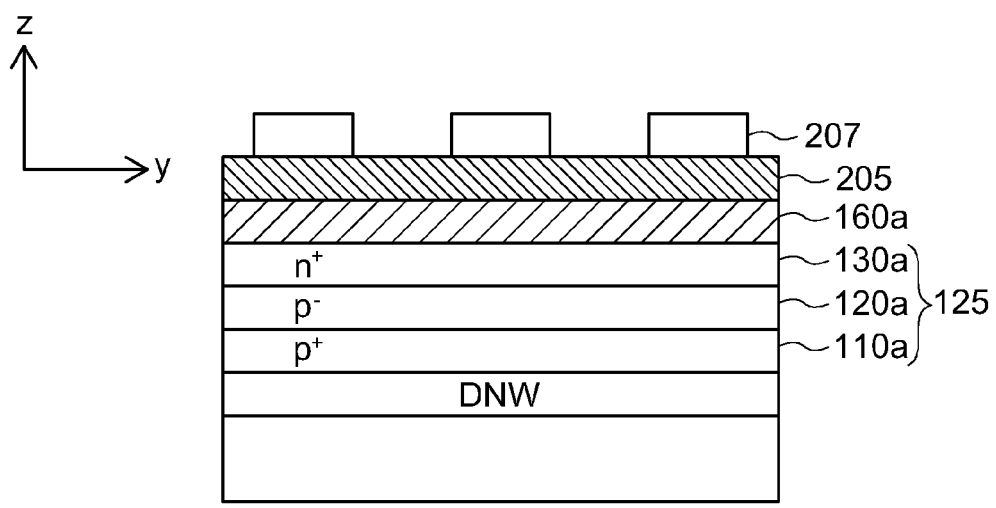
Figure 8A:
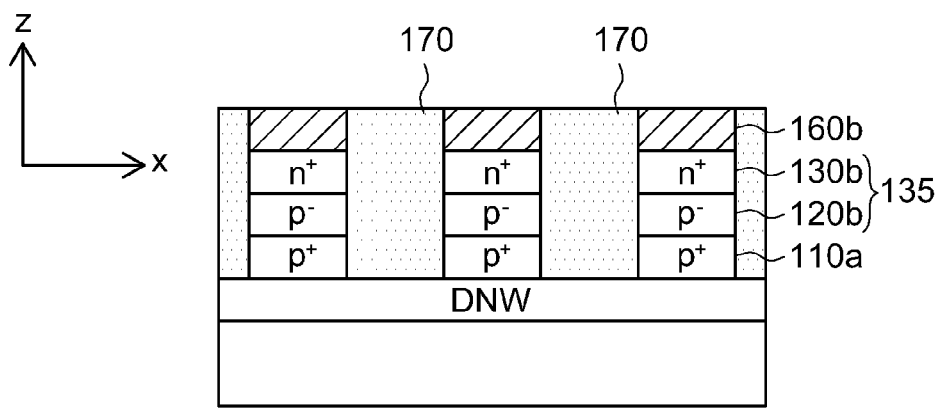
Figure 8B:
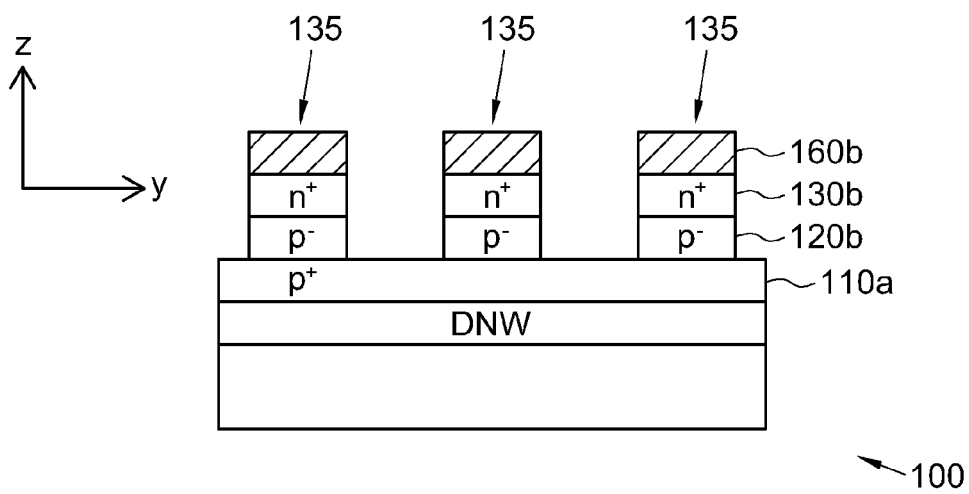

Then, in step S104, the second implanted stacked structures and the strip-shaped poly-silicon layers are etched according to a second line-type pattern perpendicular to the first line-type pattern to form a plurality of third implanted stacked structures and block-shaped poly-silicon layers that are arranged in the form of a matrix, wherein the first signal lines are not etched. As shown in FIGS. 7A and 7B, a hard mask material layer 205 is formed on the second stacked structures 125 and the first insulating layers 170, and a photo-resist material layer (not shown) is formed on the hard mask material layer 205. A patterned photo-resist layer 207 is then formed from the photo-resist material layer. The hard mask material layer 205 is next etched to form a patterned hard mask having the second line-type pattern, wherein the second line-type pattern has a plurality of parallel openings that extend along x direction and perpendicular to the first line-type pattern. The patterned photo-resist layer is then removed, and a part of the second implanted stacked structures 125, which are not covered by the patterned hard mask, is etched until the surface of the first impurity diffusion layers 110a (first signal line) for retaining the first impurity diffusion layers 110a. Last, the patterned hard mask is removed, and a plurality of third implanted stacked structures 135 and block-shaped poly-silicon layers 160b are formed, as shown in FIGS. 8A and 8B.

Since the substrate 100 and the structures on the substrate 100 are patterned sequentially along two perpendicular directions in the embodiment, the third implanted stacked structures 135 formed in the step S104 are arranged in the form of matrix. Each third implanted stacked structure 135 includes a second impurity diffusion layer 120b and a third impurity diffusion layer 130b, and a block-shaped poly-silicon layer 160b is disposed on the third impurity diffusion layer 130b. The step of etching the second implanted stacked structures 125 and the strip-shaped poly-silicon layers 160a to form the third implanted stacked structures 135 and the block-shaped poly-silicon layers 160b can also be incorporated with the process of double patterning lithography for increasing the density of memory cells.

Figure 9A:
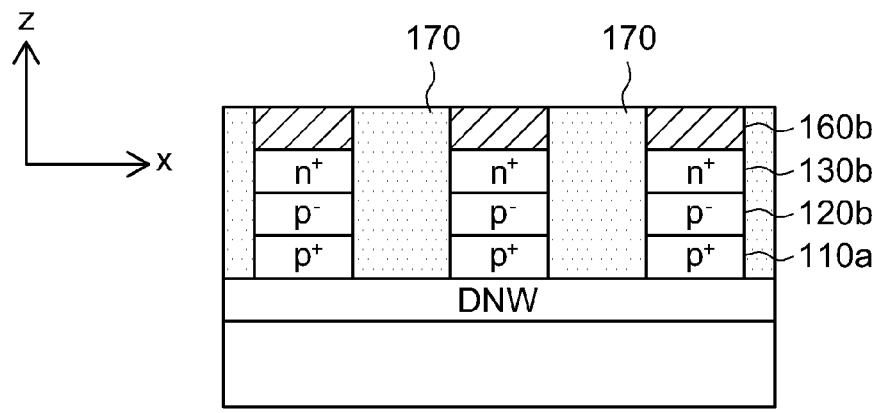
Figure 9B:
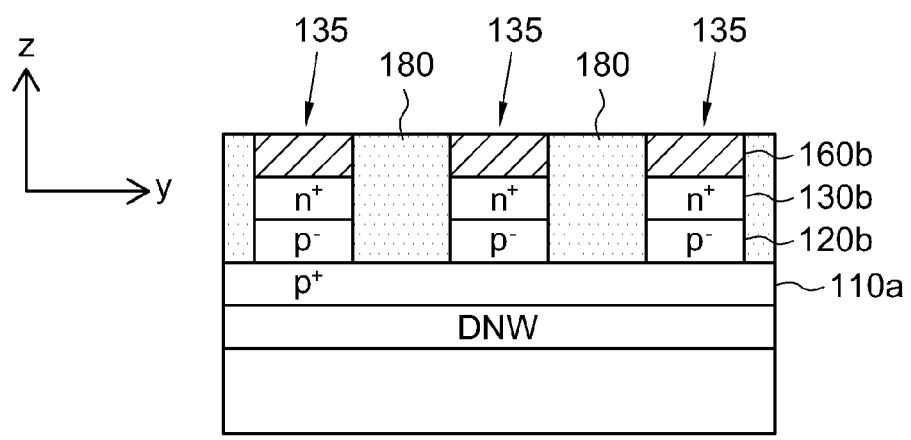
Figure 10A:
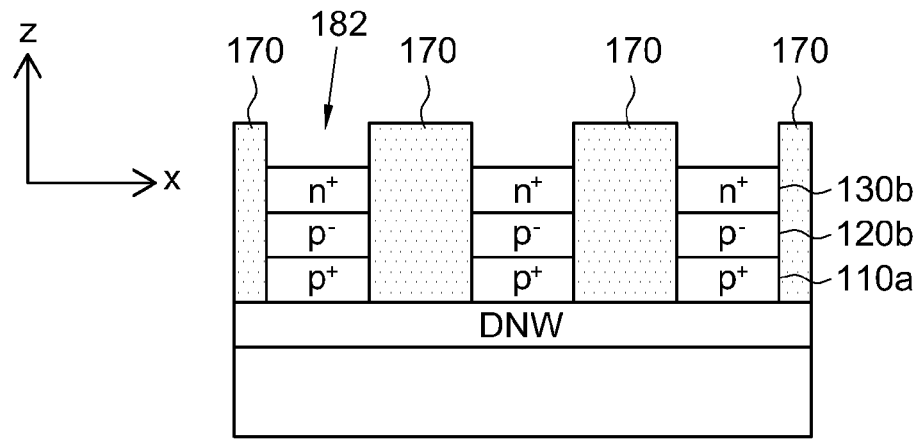
Figure 10B:
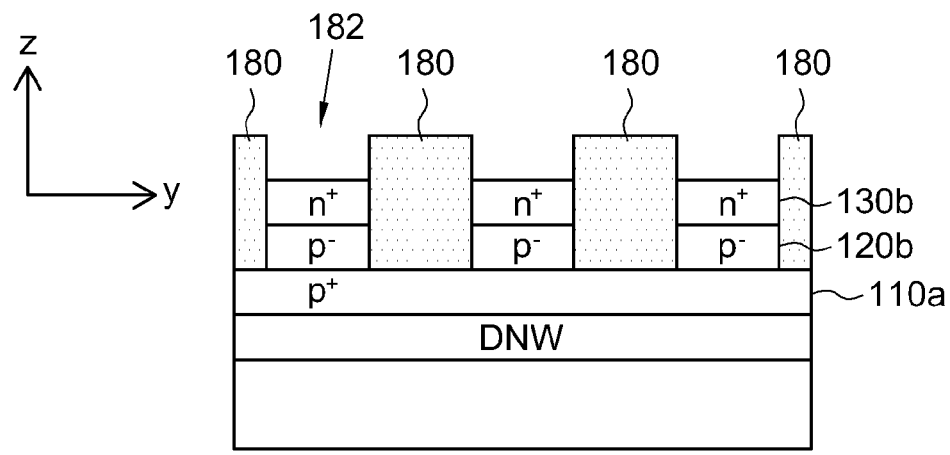

Next, in step S105, a plurality of second insulating layers are formed between the third implanted stacked structures. An insulating material (not shown) is formed on the substrate 100 and within a plurality of gaps between the third implanted stacked structures 135 by, for example, TEOS deposition process. Then, the insulating material is smoothed by, for example, CMP process to form a plurality of second insulating layers 180, as shown in FIGS. 9A and 9B. The position of the memory cells, in accordance with the position of the third stacked implanted structures 135, is clearly defined till now.

Then, in step S106, the block-shaped ploy-silicon layers 160b on the third implanted stacked structures 135 are removed to form a plurality of self-align openings 182 (shown in FIGS. 10A and 10B) that are located between the first insulating layers 170 and the second insulating layers 180 and expose the third impurity diffusion layers 130b. The block-shaped poly-silicon layers 160b are removed by, for example, dry etching or wet etching. After removed the block-shaped poly-silicon layers 160b, the openings 182 between the first insulating layers 170 and the second insulating layers 180 are revealed and arranged in the form of matrix. And, a plurality of junction structures each consisting of the second impurity diffusion layer 120b and the third impurity diffusion layer 130b are disposed in accordance with the openings 182.

Figure 11A:
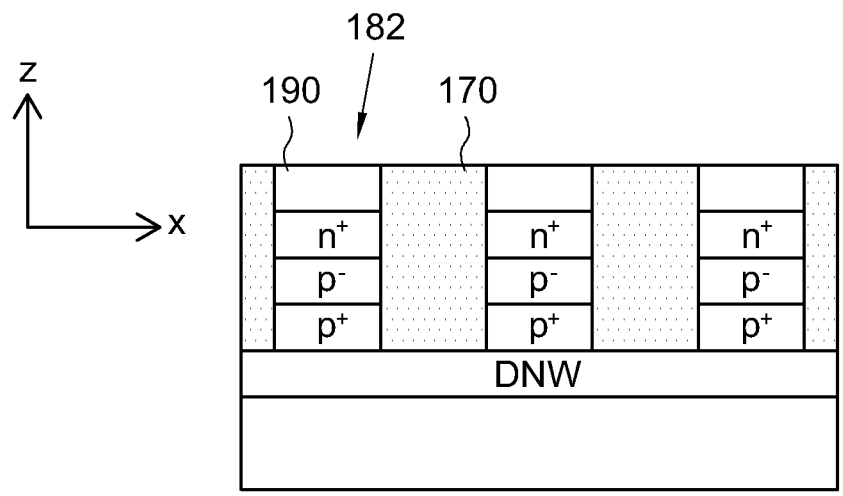
Figure 11B:
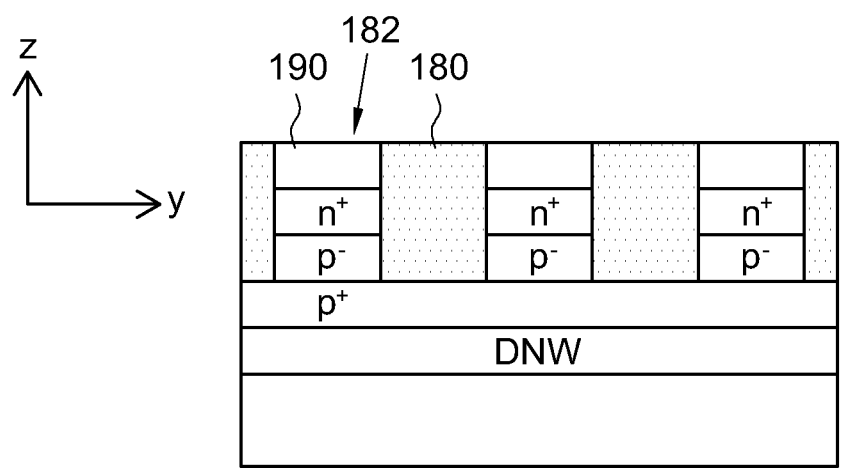
Figure 12A:
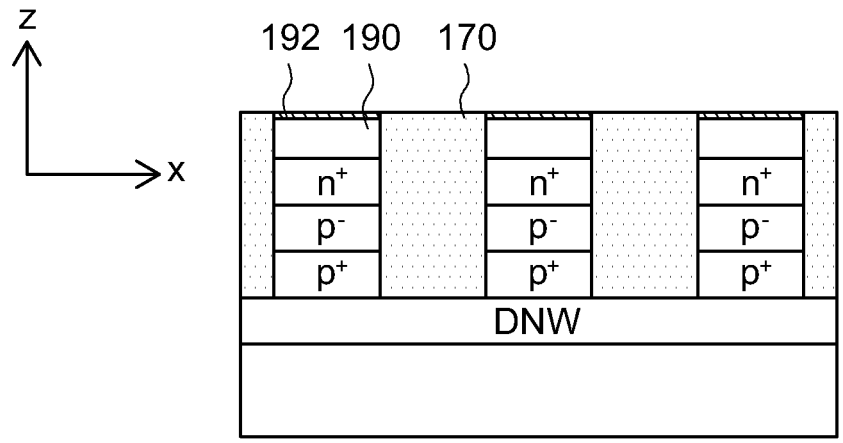
Figure 12B:
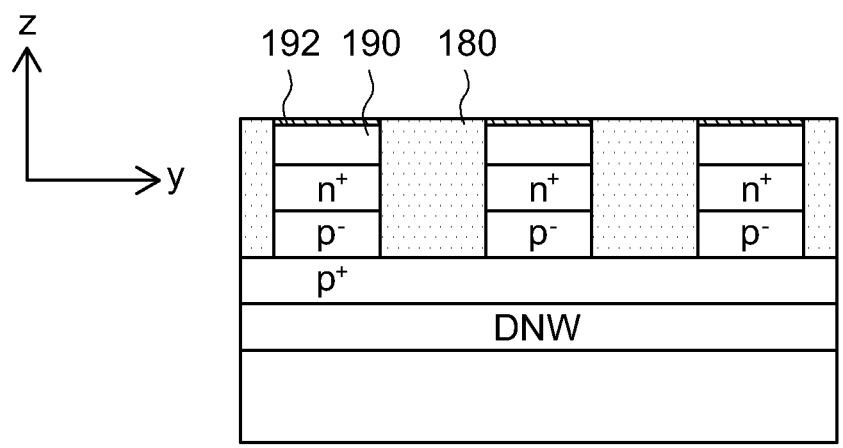

Next, in step S107, a plurality of memory material layers are formed in accordance with the openings and electrically coupled to the third impurity diffusion layers. An electrode material (not shown) is first deposited within the openings 182, wherein the electrode material is tungsten (W), tungsten silicide ($WSi_2$), titanium (Ti), aluminum (Al) or titanium nitride (TiN). The electrode material is also smoothed by, for example, CMP process, to form a plurality of electrode structures 190 within the openings 182, as shown in FIGS. 11A and 11B. Then, the surface of each electrode structure 190 is oxidized by, for example, thermal oxidation or plasma oxidation, to form a thin-film memory material layer 192, as shown in FIGS. 12A and 12B.

Figure 13A:
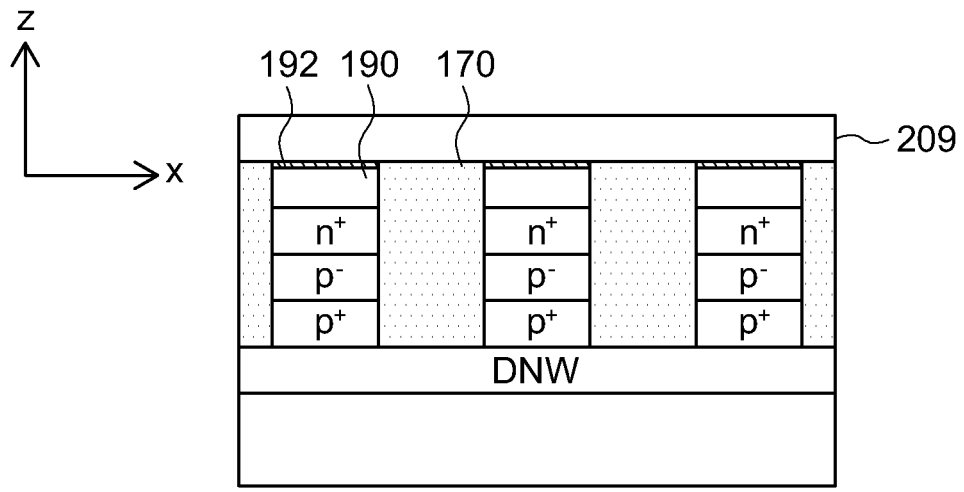
Figure 13B:
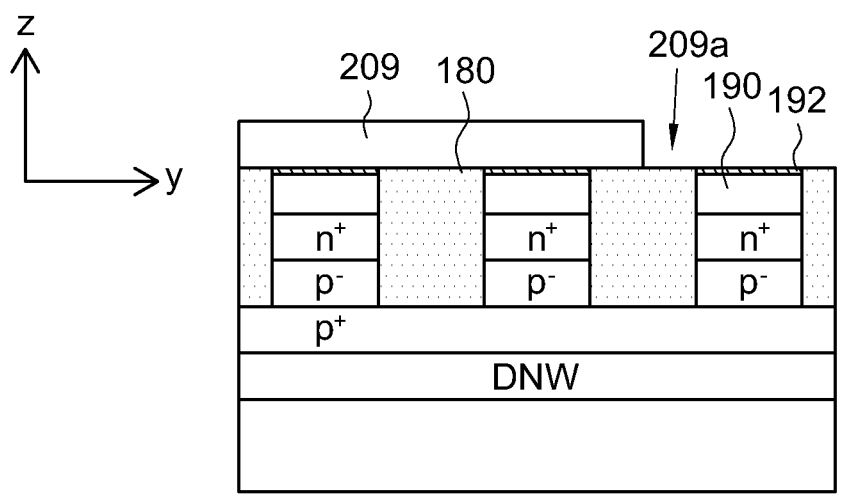

Then, a part of the memory material layers 192 can be removed for connecting the first signal lines (first impurity diffusion layers 110a) to other components in the sequential process. As shown in FIGS. 13A and 13B, a patterned photo-resist layer 209 is formed on the first insulating layers 170, the second insulating layers 180 and the memory material layers 192, wherein the patterned photo-resist layer 209 has a predetermined opening 209a to expose some of the memory material layers 192. The exposed memory material layers 192 are then etched.

Figure 14A:
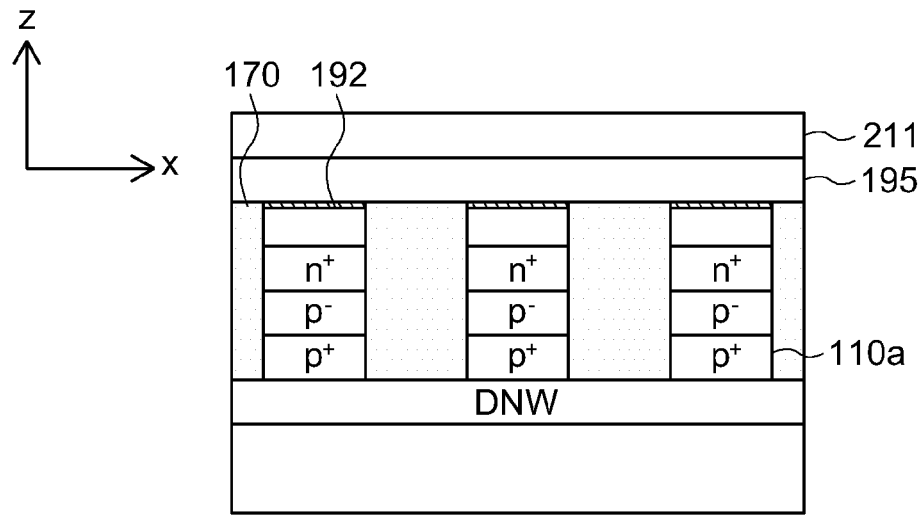
Figure 14B:
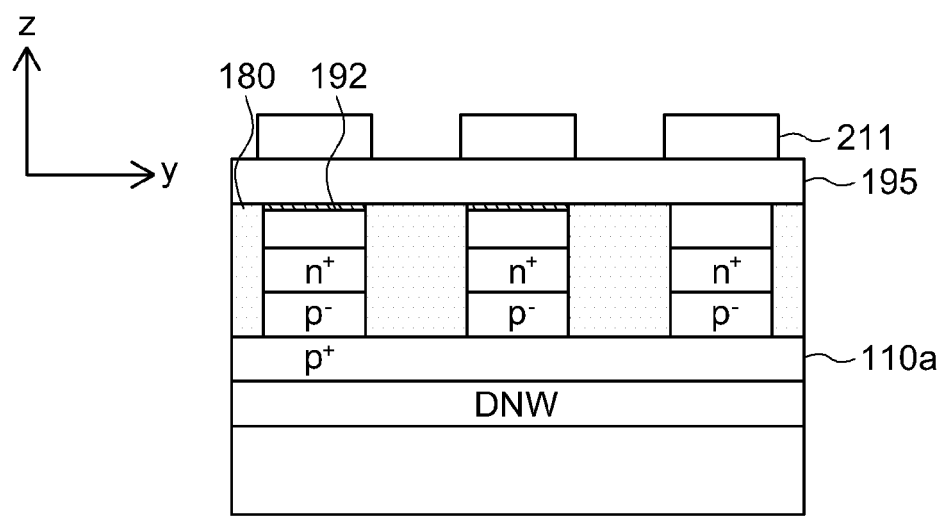
Figure 15A:
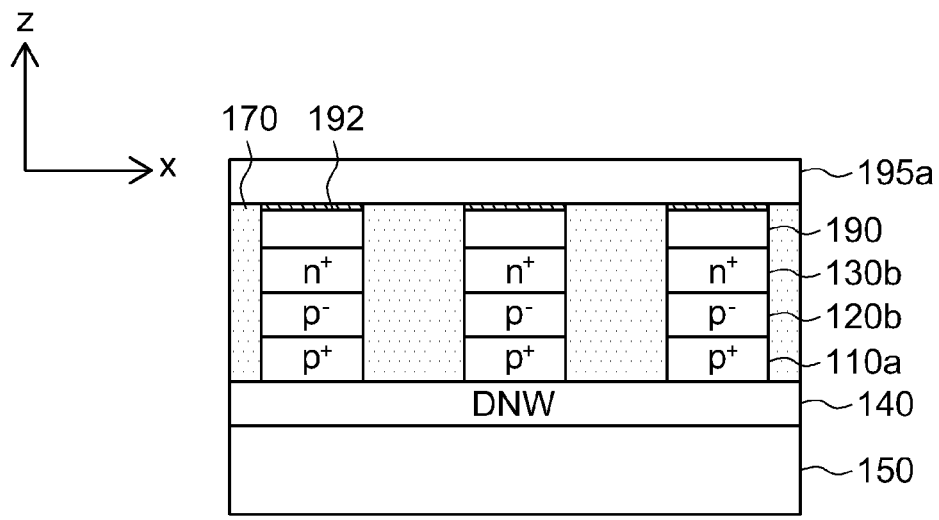
Figure 15B:
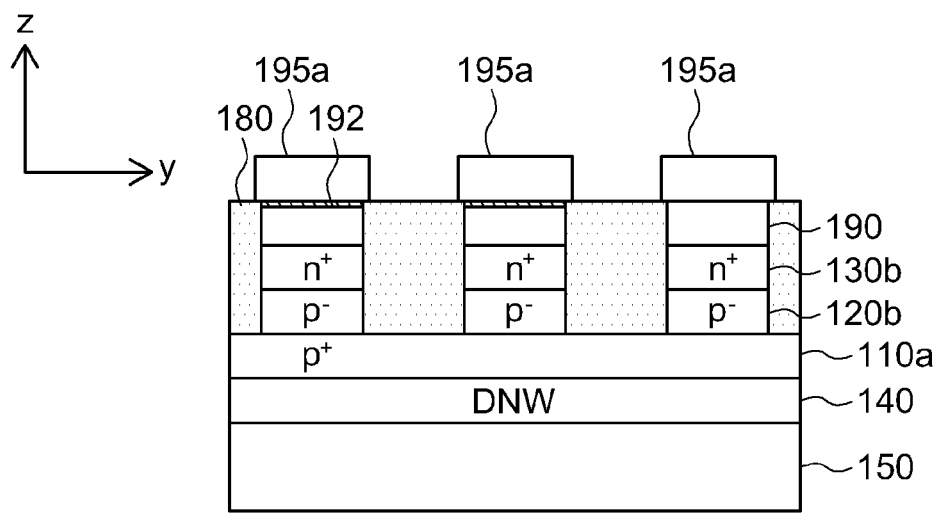

After that, in step 108, a plurality of second signal lines perpendicular to the first signal lines are formed and electrically coupled to the memory material layers. As shown in FIGS. 14A and 14B, a conductive material layer 195 is first formed on the first insulating layers 170, the second insulating layers 180 and the memory material layers 192. Then, a patterned photo-resist layer 211 is formed on the conductive material layer 195, wherein the patterned photo-resist layer 211 has a line-type pattern extending along x direction for being perpendicular to the first impurity diffusion layers 110a (first signal line). A part of the conductive material layer 195 that is not covered by the patterned photo-resist layer 211 is then etched. After removed the patterned photo-resist layer 211, as shown in FIGS. 15A and 15B, a plurality of second signal lines 195a are formed and electrically coupled to the memory material layers 192. Preferably, the width of each second signal line 195a is greater than that of the memory material layer 192. And, the second signal line 195a corresponding to the removed memory material layer 192, for example located at the right-most position in FIG. 15B, is electrically coupled to the first signal lines (first impurity diffusion layers 110a). After the step S108 is performed, the manufacture of the resistive memory device is completed.

The resistive memory device can be resistive random-access memory (RRAM), phase change memory (PCM), or programmable metallization cell (PMC) memory. As shown in FIGS. 15A and 15B, the resistive memory device the base layer 150, the deep implanted layer 140, the first signal lines (first impurity diffusion layers 110a), an insulating structure, which consists of the first insulating layers 170 and the second insulating layers 180, the junction structures (each consist of the second impurity diffusion layer 120b and the third impurity diffusion layer 130b), the electrode structures 190, the memory material layers 192, and the second signal lines 195a. The first signal lines are disposed on the base layer 150 in parallel for being used as bit select lines. The memory cells consisting of the junction structures, the electrode structures 190 and the memory material layers 192 are located at the intersections of the first signal lines (first impurity diffusion layers 110a) and the second signal lines 195a, and interposed between the first signal lines and the second signal lines 195a.

Figure 16A:
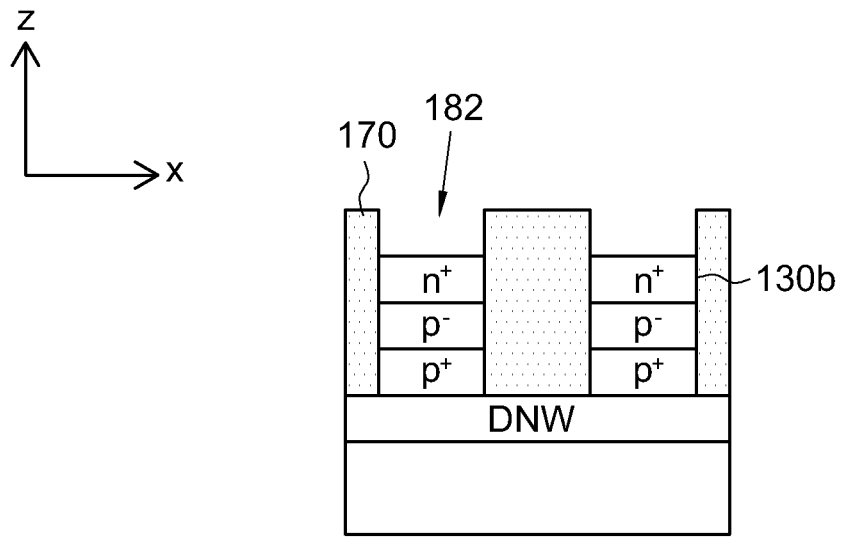
FIGS. 16A to 16D are diagrams showing the process of reducing the active area.
Figure 16B:
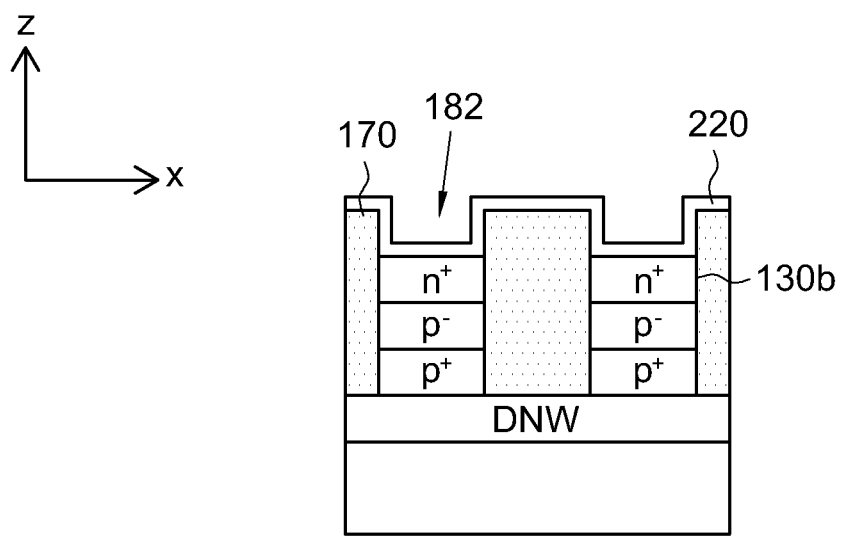
Figure 16C:
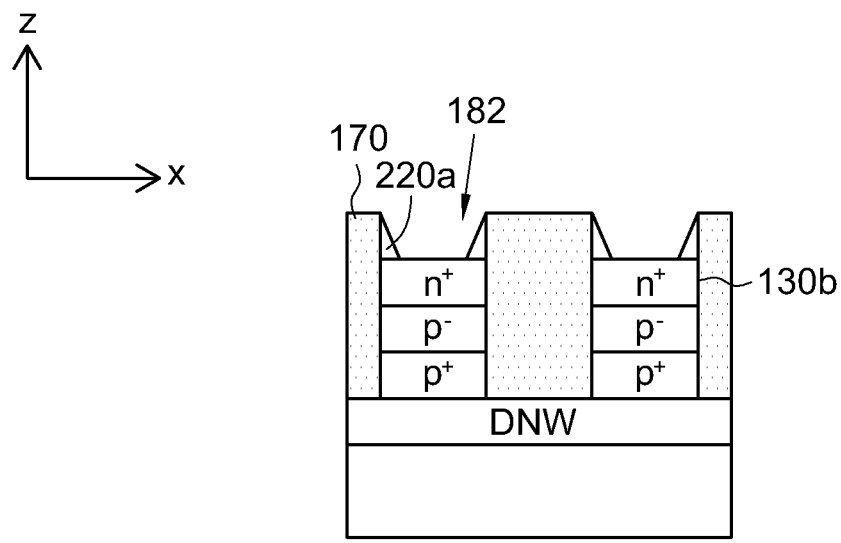
Figure 16D:
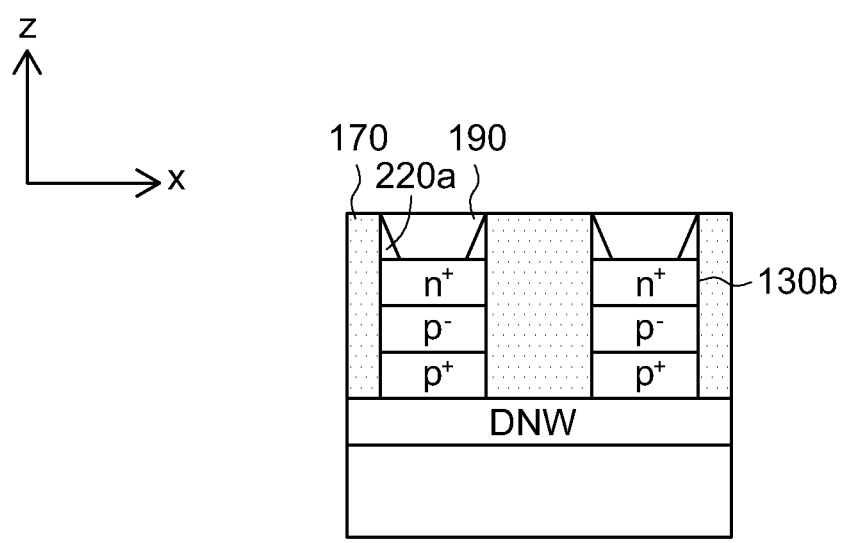

In the embodiment, the electrode structures are disposed within the openings of the insulating structure for directly coupling to the surface (active area) of each third impurity diffusion layer 130b. However, before the step of forming the electrode structures within the openings, the active area of the third impurity diffusion layer 130b can be reduced for increasing current density, and further lowering required energy. Refer to FIGS. 16A to 16D, which are diagrams showing the process of reducing the active area. First, a spacer material 220 is deposited on the first insulating layers 170, the second insulating layers 180 (not shown) and the third impurity diffusion layers 130b. Then, the spacer material 220 is etched to form a plurality of spacer layers 220a within the openings 182, wherein each spacer layer 220a is disposed along the inner wall of the opening 182 and expose partial surface of each third impurity diffusion layer 130b, so as to reduce the active area of the third impurity diffusion layer 130b. After that, the electrode structure 190 is formed within the opening 182, as shown in FIG. 16D.

Figure 17A:
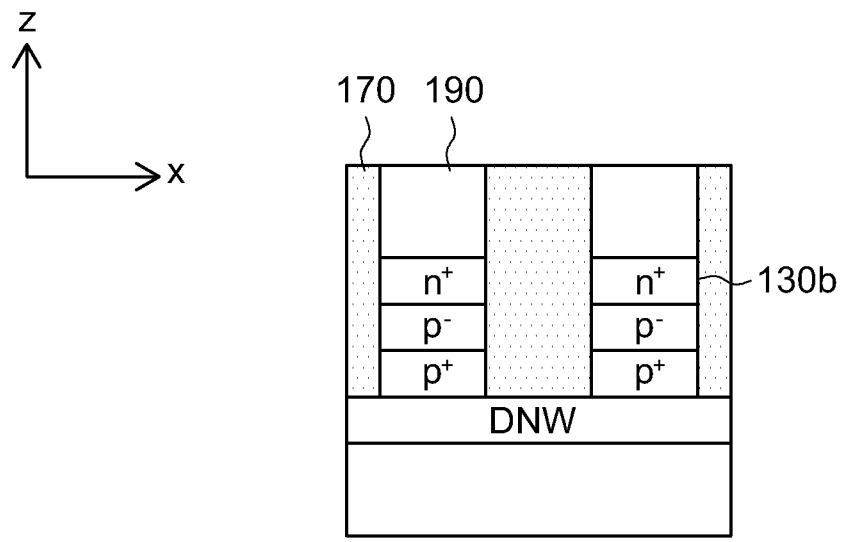
FIGS. 17A to 17D are diagrams showing the process of forming electrode structures protruding from the openings of insulating structure.
Figure 17B:
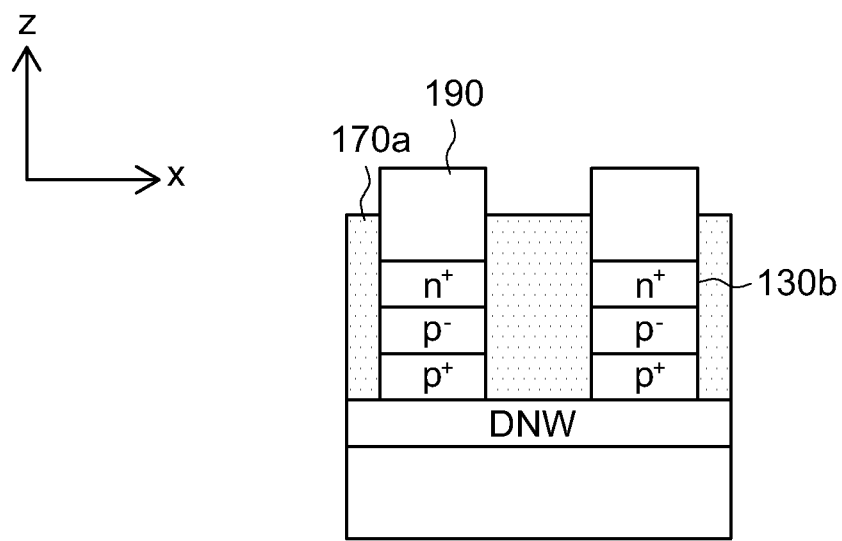
Figure 17C:
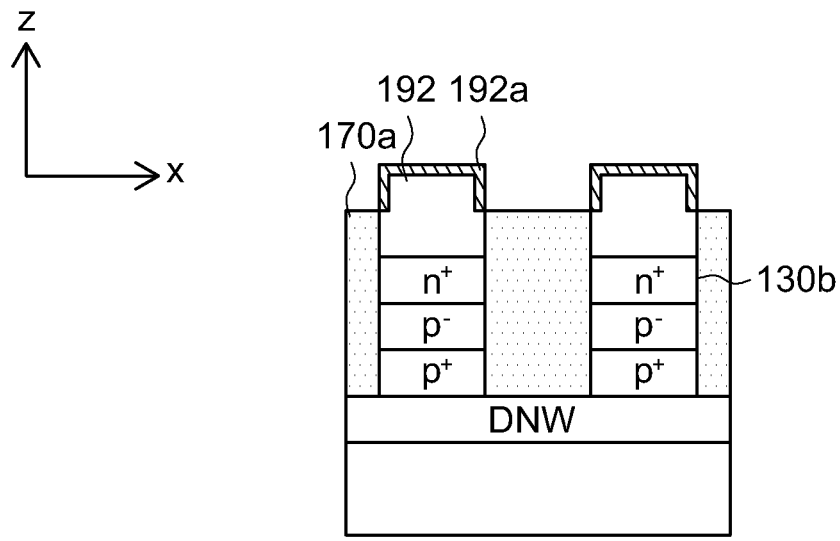
Figure 17D:
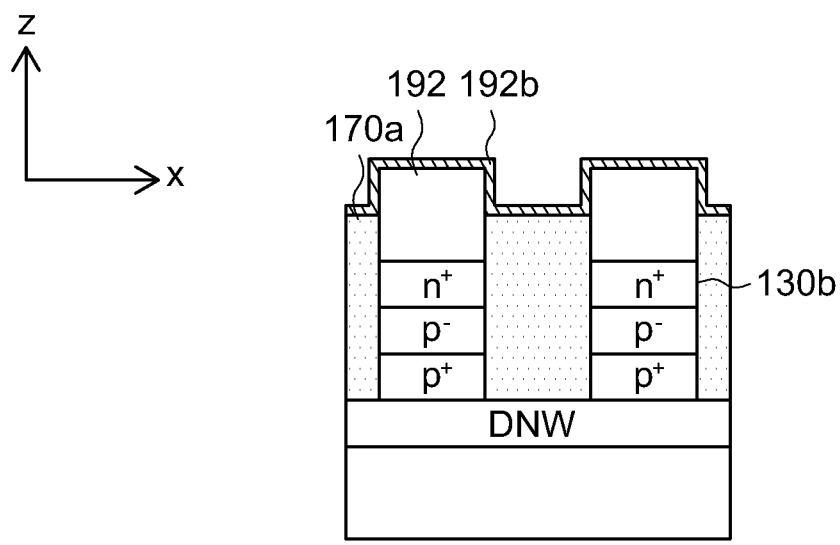

The electrode structure 190 can be formed in other shape for increasing the efficiency of the electrode structure 190. Refer to FIGS. 17A to 17D, which are diagrams showing the process of forming electrode structures protruding from the openings of insulating structure. In this step, the first insulating layers 170 and the second insulating layers 180 (not shown) are partially removed, so the height of the first insulating layers 170 and the second insulating layers 180 is shortened, such that the electrode structures 190 are protruding from the first insulating layers 170 and the second insulating layers 180. Afterwards, the surface of each electrode structure 190 is oxidized for forming a memory material layer 192a, as shown in FIG. 17C. Besides oxidizing the electrode structure 190, the memory material layer can also be formed by depositing a memory material on the surface of the electrode structure 190, such as the memory material layer 192b shown in FIG. 17D.

Figure 18:
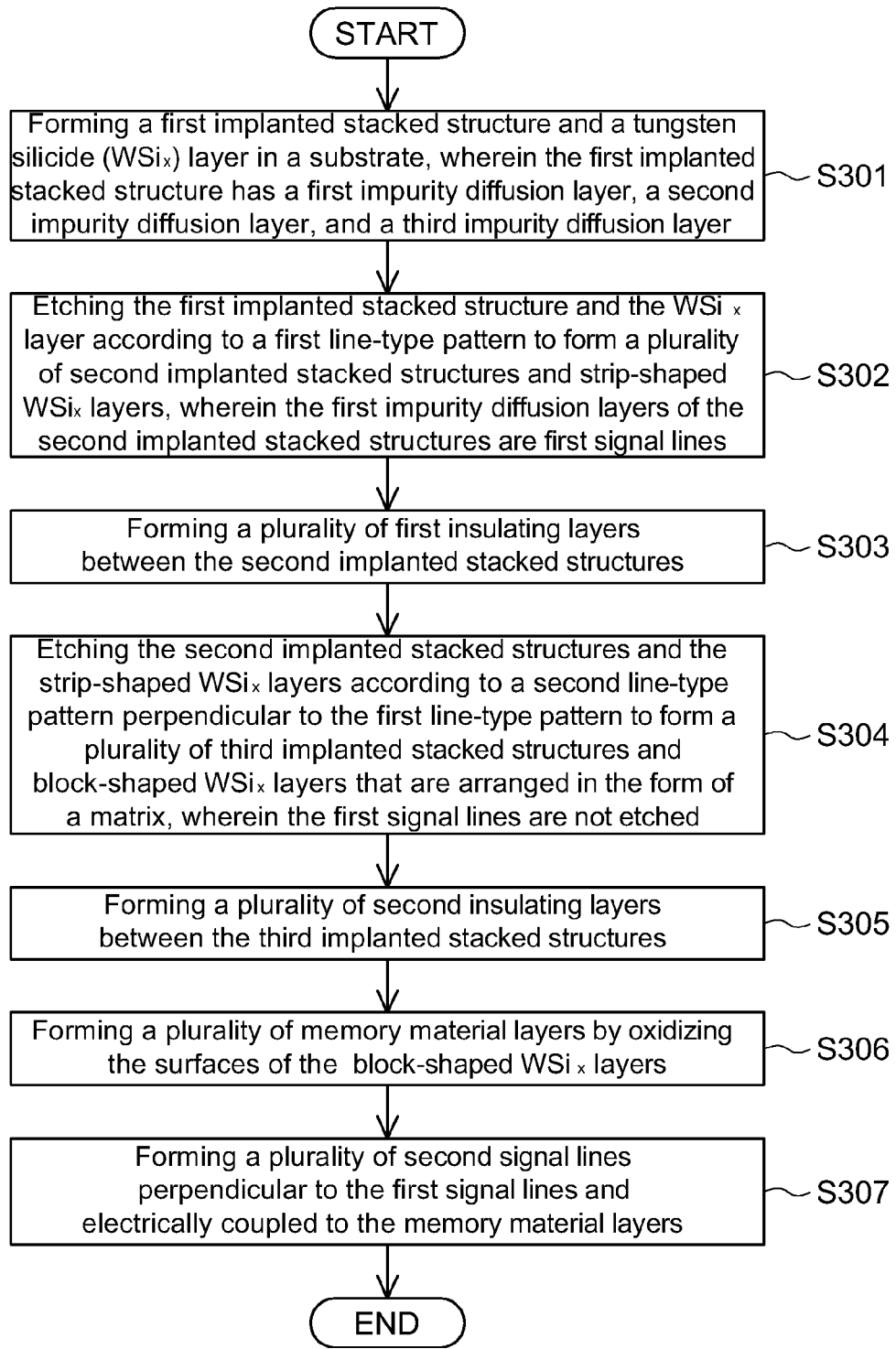
FIG. 18 is a diagram showing the flowchart of a manufacturing method of resistive memory device according to the second embodiment of the invention.

FIG. 18 is a diagram showing the flowchart of a manufacturing method of resistive memory device according to the second embodiment of the invention. FIGS. 19 to 27B are diagrams showing different steps in accordance with the method of FIG. 18.

Figure 19:
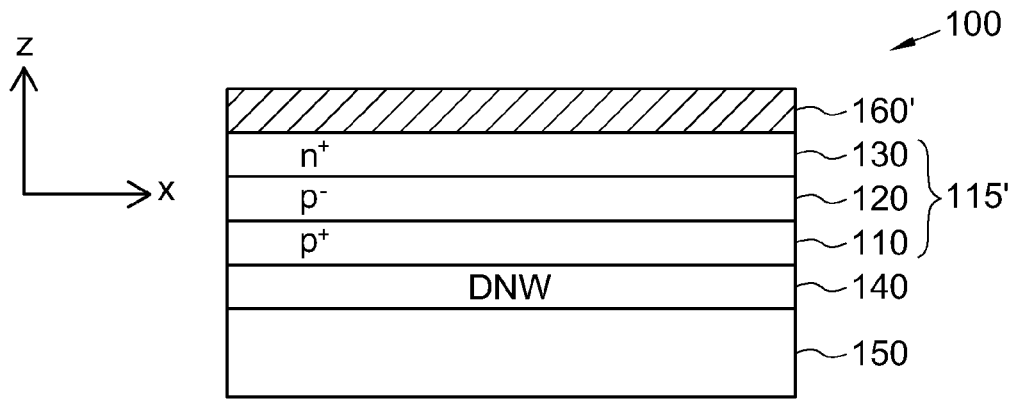
FIGS. 19 to 27B are diagrams showing different steps in accordance with the method of FIG. 18.

As shown in step S301 and FIG. 19, a first implanted stacked structure 115' and a tungsten silicide (WSi$_x$) layer 160' are formed in a substrate 100, wherein the first implanted stacked structure 115' has a first impurity diffusion layer 110, a second impurity diffusion layer 120 and a third impurity diffusion layer 130. The step S301 is the same as the step S101 of the first embodiment and is not elaborated here again. However, over the third impurity diffusion layer 130 is the tungsten silicide layer 160' instead of the poly-silicon layer 160 of the first embodiment. The tungsten silicide layer 160' can be formed by depositing its material on the third impurity diffusion layer 130.

Figure 20A:
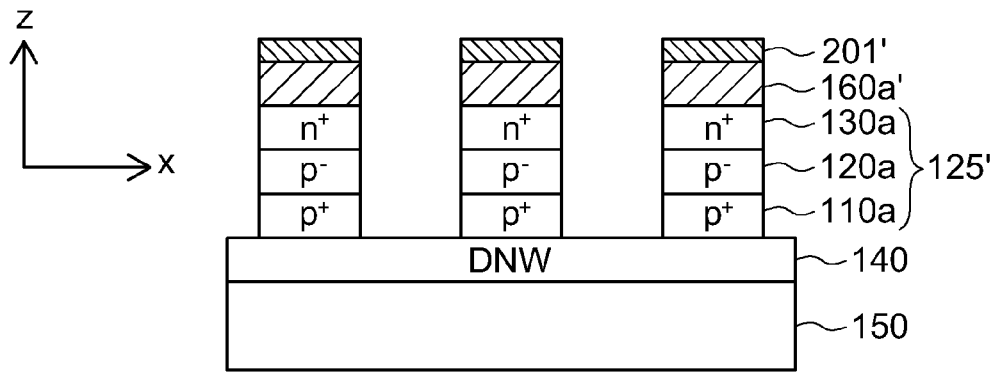
Figure 20B:
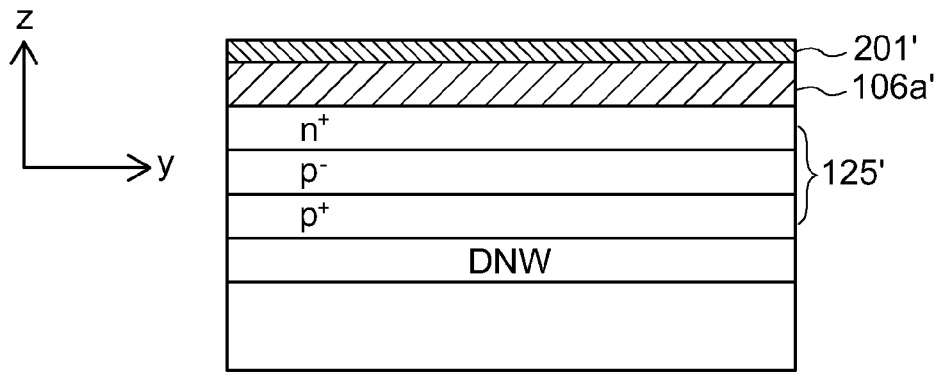

Next, as shown in step S302, the first implanted stacked structure 115' and the WSi$_x$ layer 160' are etched according to a first line-type pattern to form a plurality of second implanted stacked structures 125' and stripe-shape WSi$_x$ layers 160a', wherein the first impurity diffusion layers of the second stacked structure 125' are first signal lines. This step is similar to the step S102 of the first embodiment. As shown in FIGS. 20A and 20B, the patterned hard mask 201' is temporary retained on the second implanted stacked structures 125' for the sake of the following process. The material of the patterned hark mask 201' is, for example, silicon nitride (SiN).

The second implanted stacked structures 125' are bar-shaped and parallel to each other along y direction. Each second implanted stacked structure 125' includes a first impurity diffusion layer 110a, a second impurity diffusion layer 120a and a third impurity diffusion layer 130a, and a WSi$_x$ layer 160a' is disposed on the third impurity diffusion layer 130a, wherein the first impurity diffusion layer 110a is used as a first signal line. The step of etching the first implanted stacked structure 115' and the WSi$_x$ layer 160' to form the second implanted stacked structures 125' and the strip-shaped WSi$_x$ layers 160a' can be incorporated with the process of double patterning lithography for increasing the density of memory cells.

Figure 21A:
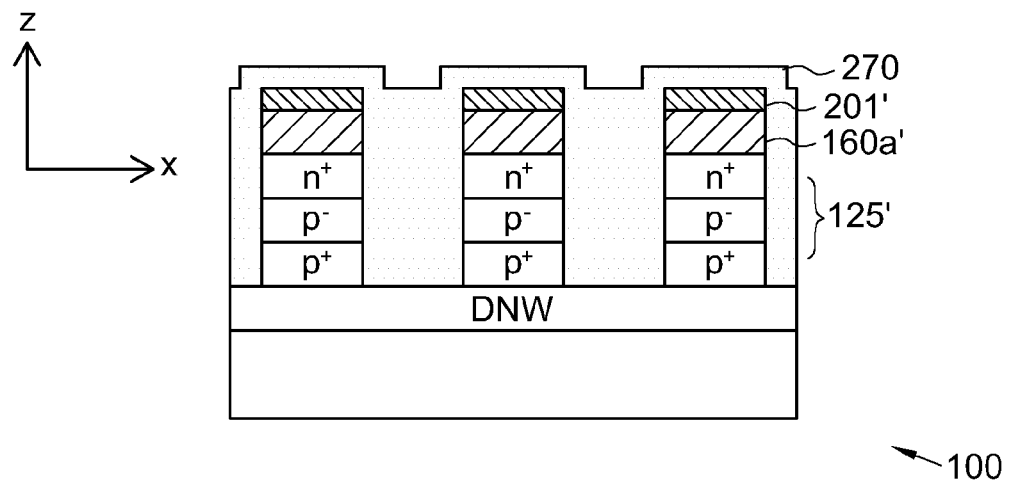
Figure 21B:
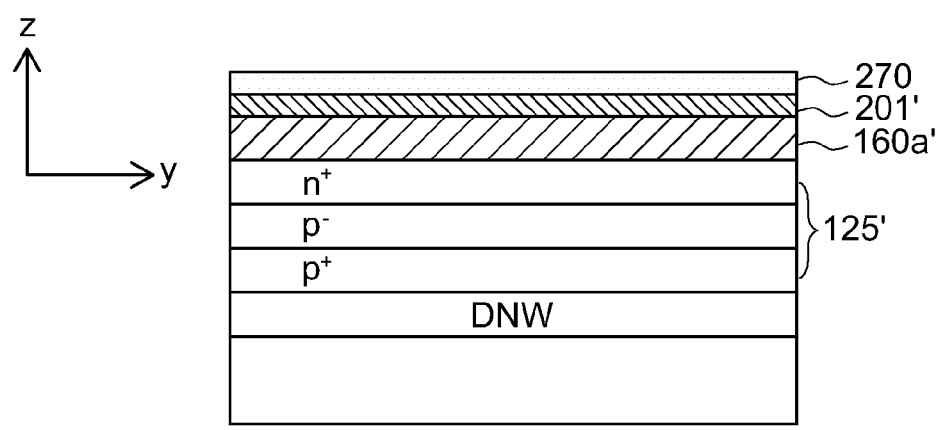
Figure 22A:
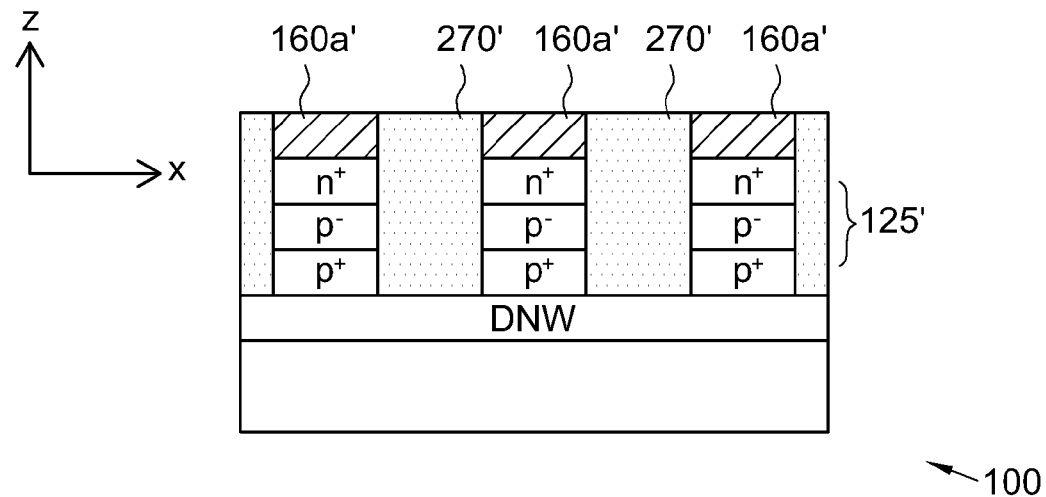
Figure 22B:
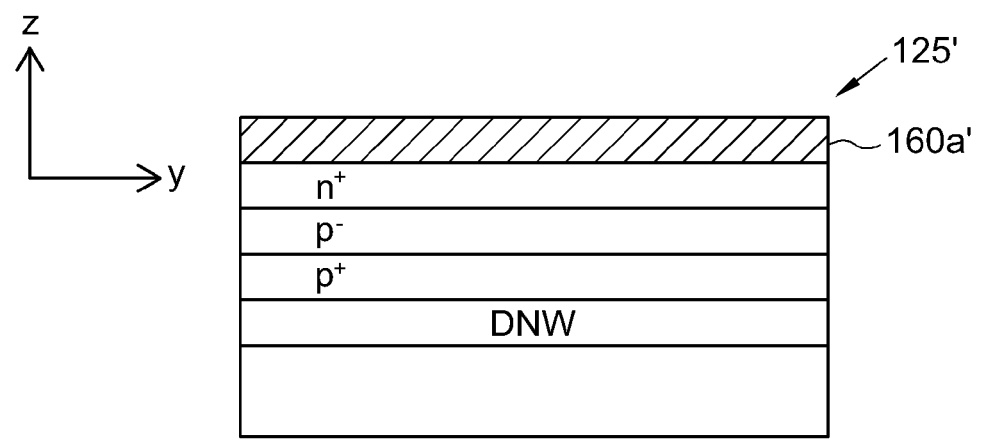

Then, as shown in step S303, a plurality of first insulating layers are formed between the second implanted stacked structures. This step is similar to the step S103 of the first embodiment however, as shown in FIGS. 21A and 21B, the insulating material 270 used in TEOS process not only fills in the gaps between the second implanted stacked structures 102' but also covers on the patterned hard mask 201'. After that, the insulating material 270 is smoothed by CMP process first, and then the patterned hard mask 201' is removed by dry etching. As shown in FIGS. 22A and 22B, the WSi$_x$ layers 160a' are therefore exposed, and the first insulating layers 270' are formed.

Figure 23A:
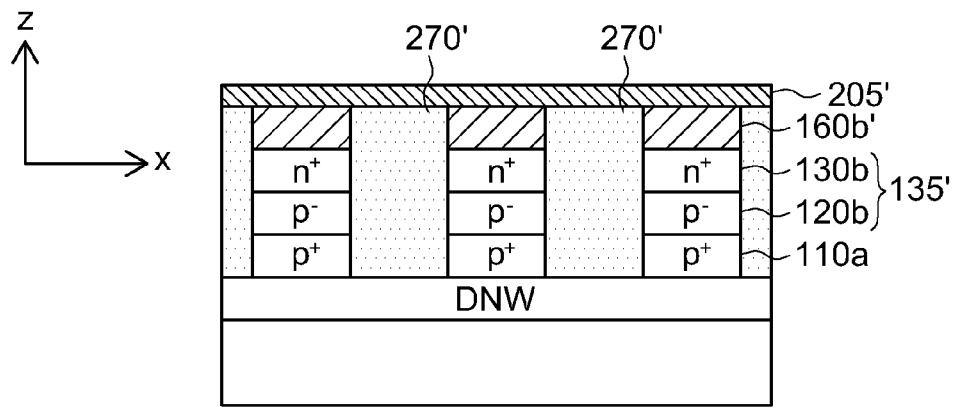
Figure 23B:
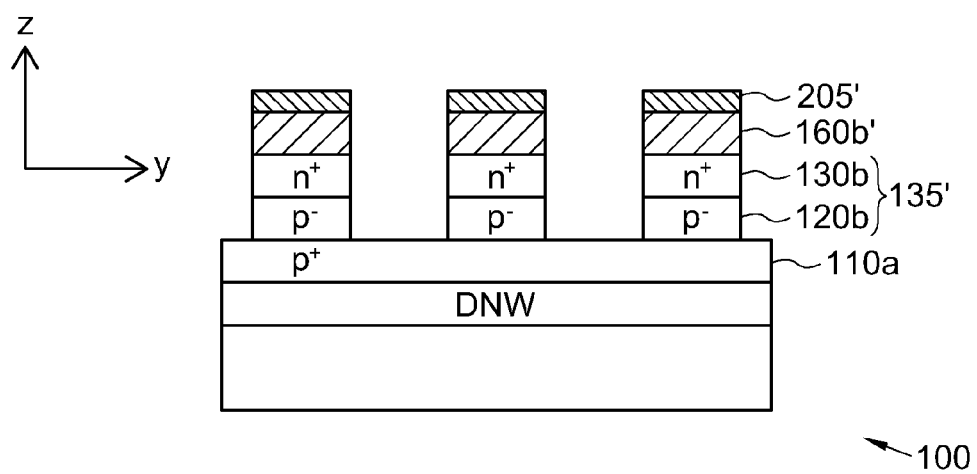

Next, as shown in S304, the second implanted stacked structures 125' and the strip-shaped WSi$_x$ layers 160a' are etched according to a second line-type pattern perpendicular to the first line-type pattern to form a plurality of third implanted stacked structures and block-shape WSi$_x$ layers that are arranged in the form of a matrix. This step is similar to the step S104 of the first embodiment. As shown in FIGS. 23A and 23B, a plurality of third implanted stacked structures 135' and block-shape WSi$_x$ layers 160b' are formed in the step, and the patterned hard mask 205' is temporary retained on the third implanted stacked structures 135' for the following process.

Since the substrate 100 and the structures on the substrate 100 are patterned sequentially along two perpendicular directions in the embodiment, the third implanted stacked structures 135' and the block-shape WSi$_x$ layers 160b' are arranged in the form of matrix. Each third implanted stacked structure 135' includes a second impurity diffusion layer 120b and a third impurity diffusion layer 130b, and a block-shape WSi$_x$ layer 160b' is disposed on the third impurity diffusion layer 130b. The step of etching the second implanted stacked structures 125' and the strip-shaped WSi$_x$ layers 160a' to form the third implanted stacked structures 135' and the block-shaped WSi$_x$ layers 160b' can also be incorporated with the process of double patterning lithography for increasing the density of memory cells.

Figure 24A:
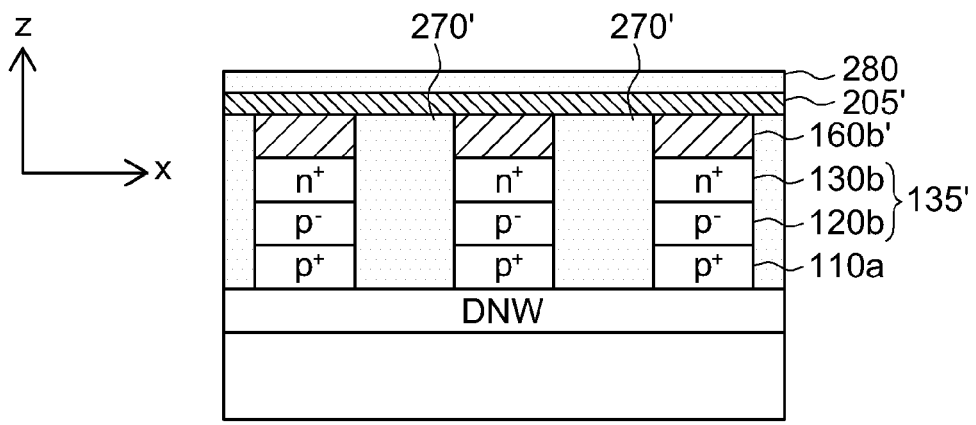
Figure 24B:
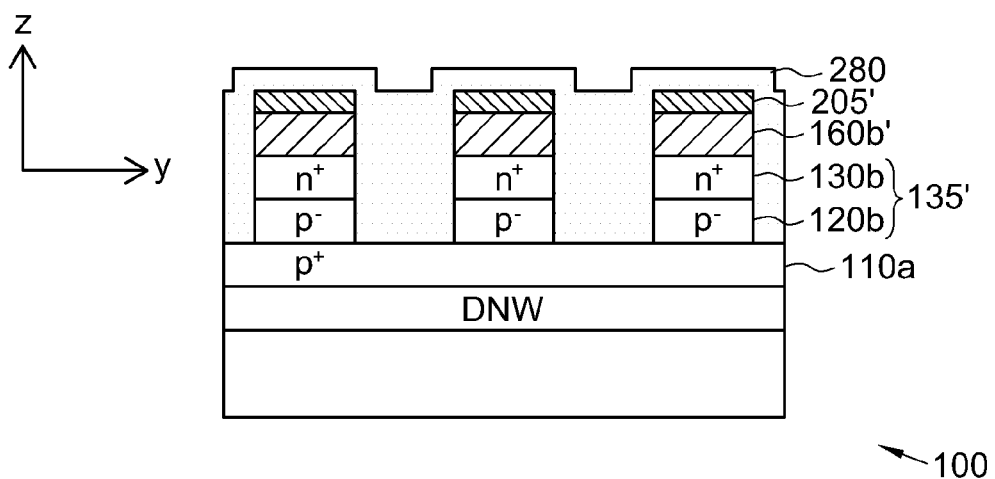
Figure 25A:
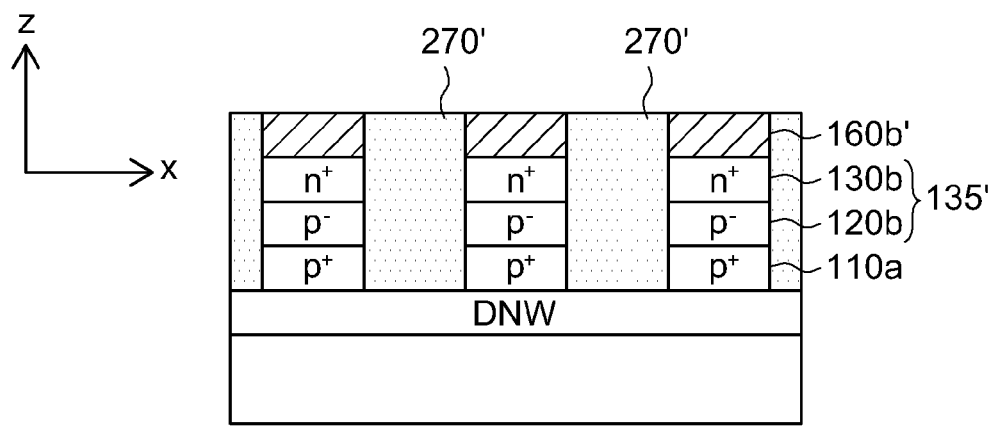
Figure 25B:
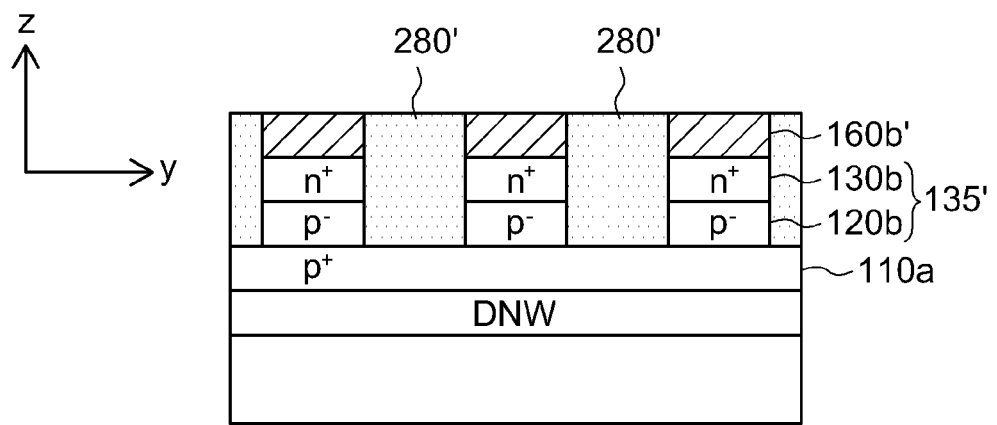

Then, as shown in step S305, a plurality of second insulating layers are formed between the third implanted stacked structures. In the step, an insulating material is disposed on the substrate 100 by TEOS process. As shown in FIGS. 24A and 24B, the insulating material 280 is filled in the gaps between the third implanted stacked structures 135' as well as covers the patterned hard mask 205'. Afterwards, the insulating material 280 is smoothed by CMP process first, then the patterned hard mask 205' is removed by dry etching, so as to expose the WSi$_x$ layers 160b' and form the second insulating layers 280', as shown in FIGS. 25A and 25B. The position of the memory cells, in accordance with the position of the third stacked structures 135', is clearly defined till now.

Figure 26A:
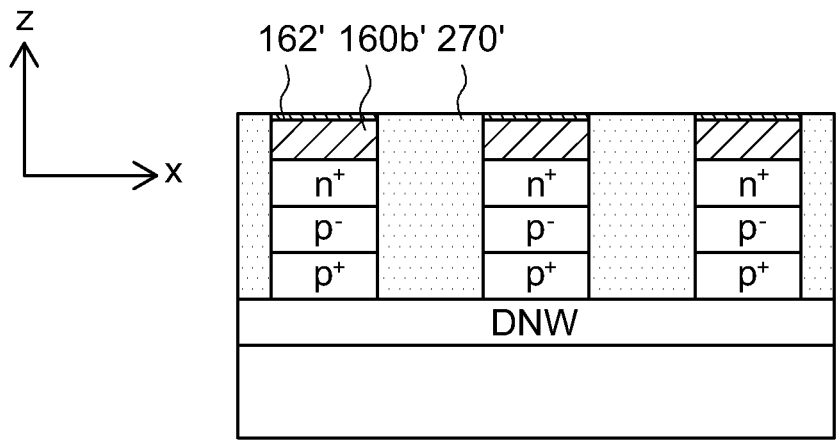
Figure 26B:
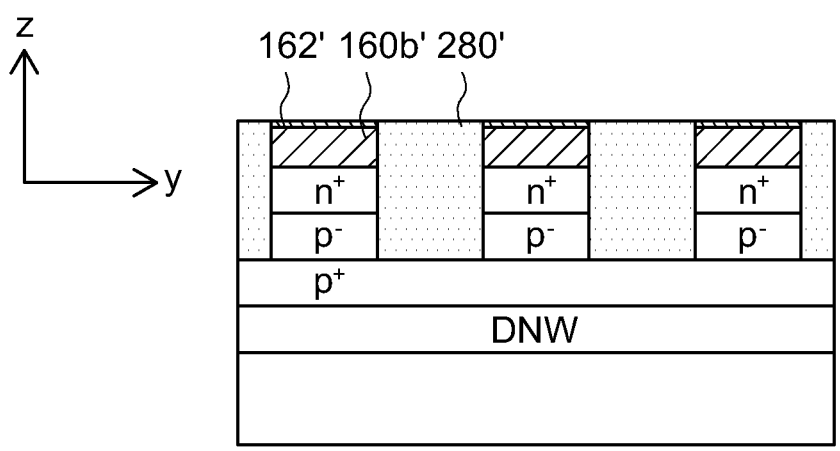

Next, as shown in step S306 and FIGS. 26A and 26B, the surfaces of the block-shaped WSi$_x$ layers 160b' are oxidized by, for example, thermal oxidation or plasma oxidation, to form a plurality of memory material layers (tungsten silicon oxide layers) 162'.

Then, a part of the memory material layers 162' can be removed for connecting the first signal lines (first impurity diffusion layers 110a) to other components in the sequential process.

Figure 27A:
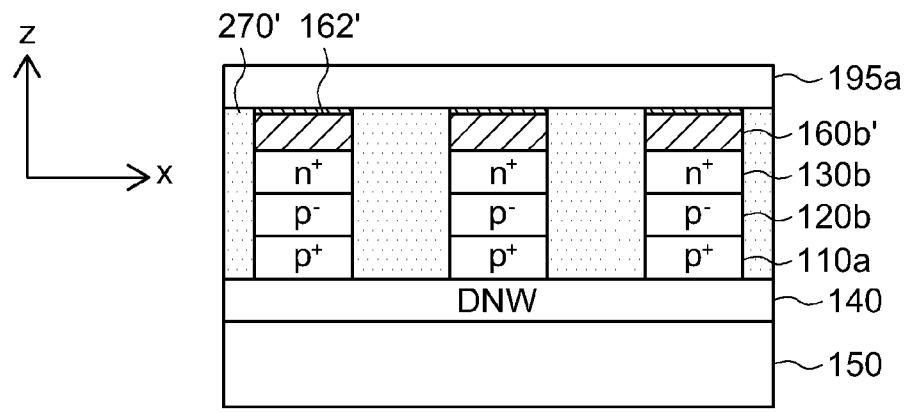
Figure 27B:
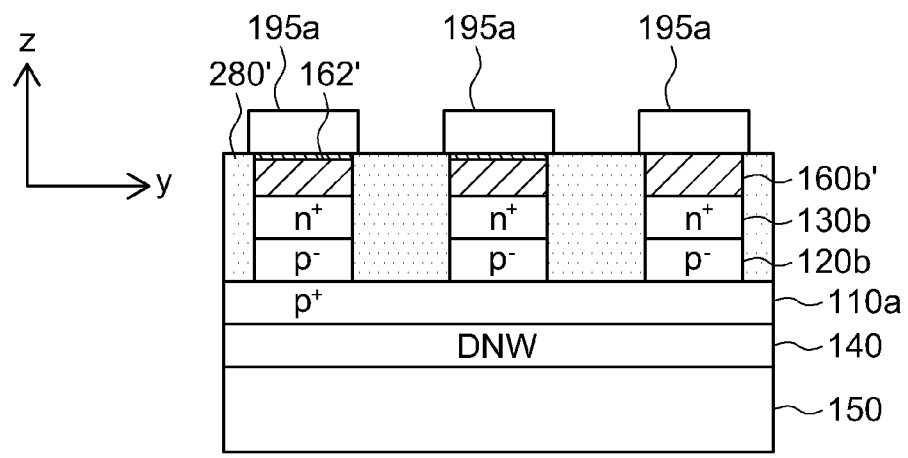

Next, as shown in step S307 and FIGS. 27A and 27B, a plurality of second signal lines 195a perpendicular to the first signal lines are formed and electrically coupled to the memory material layers. This step is similar to the step S108 of the first embodiment and is not elaborated here again.

The WSi$_x$ layers 160b' of the embodiment can be formed in other shape for increasing its efficiency. For example, the height of the insulating layers 270' and 280' can be shrunk so that the WSi$_x$ layers 160b' are protruding out of the insulating layers and have larger outer surfaces used for memory material layers.

Figure 28:
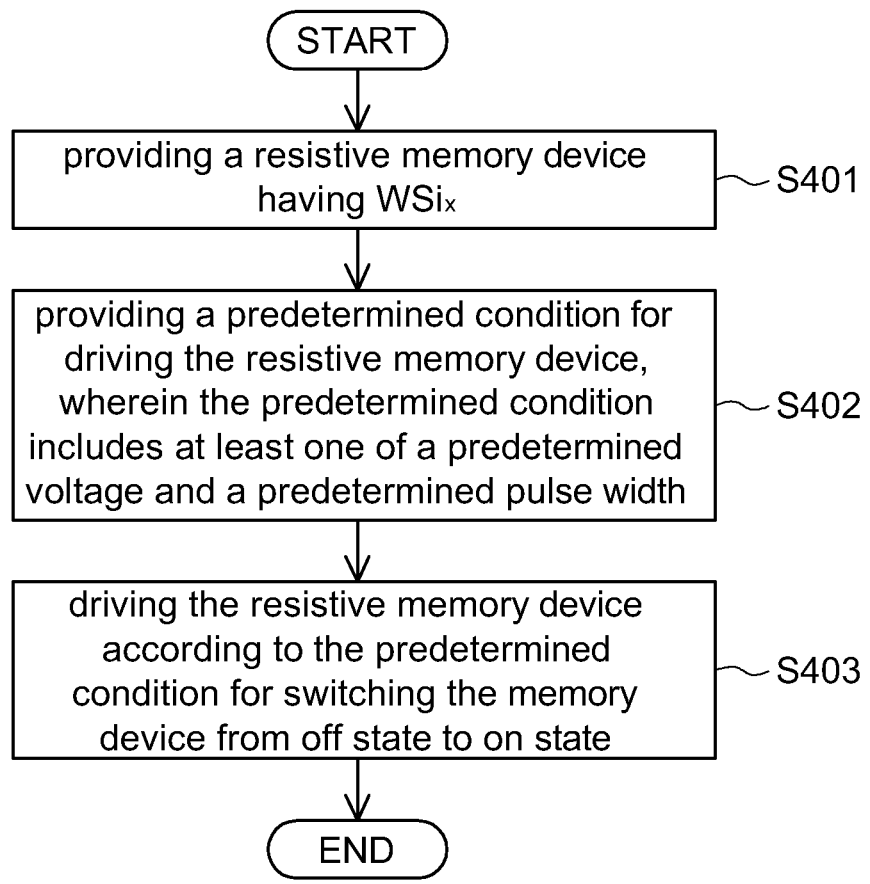
FIG. 28 is a diagram showing the flowchart of a method for operating a resistive memory device according to the second embodiment of the invention.

FIG. 28 is a diagram showing the flowchart of a method for operating a resistive memory device according to the second embodiment of the invention. First, as shown in step S401, a resistive memory device having tungsten silicide (WSi$_x$) is provided. The resistive memory device is, for example, fabricated according to the method in FIG. 18 and has electrode structures containing WSi$_x$.

Next, as shown in step S402, a predetermined condition for driving the resistive memory device is provided, wherein the predetermined condition includes at least one of a predetermined voltage and a predetermined pulse width. It is noted that the resistive memory device of the embodiment can be driven by at least two different predetermined conditions, and satisfies the requirements for multi-level cell (MLC) operation, which is elaborated afterwards. One of the predetermined conditions is that the predetermined voltage is set to be between 3 volt and 5 volt, or preferably 3.5 volt, the predetermined pulse width is set to be about 100 nanosecond (ns). Another one of the predetermined conditions is that the predetermined voltage is set to be about 2.5 volt, the predetermined pulse width is greater than 500 ns.

Then, as shown in step S403, the resistive memory device is driven according to the predetermined condition for switching the memory device from off state to on state. The resistive memory device having tungsten silicide is operated and tested, and the test results are recorded in diagrams and elaborated in the following.

Figure 29:
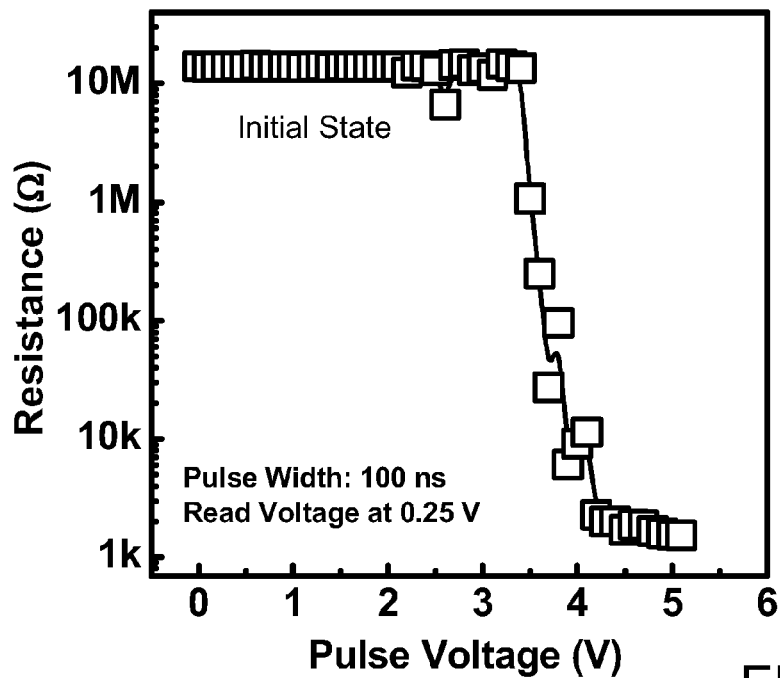
FIG. 29 is a diagram showing a pulse-voltage sweeping test result of the resistive memory device of the second embodiment.

FIG. 29 is a diagram showing a pulse-voltage sweeping test result of the resistive memory device of the second embodiment. The predetermined condition in the test is that the predetermined pulse is 100 ns, the applied pulse voltage starts from 0 volt. The current of the resistive memory device with 0.25 volt is read so as to calculate the corresponding resistance. As shown in FIG. 29, in the beginning of the test, the resistance of the resistive memory device is about 10MΩ, so the resistive memory device is similar to an insulator. As the pulse voltage is greater than 3 volt, or preferably 3.5 volt, the resistance of the resistive memory device is gradually declining. As the pulse voltage is about 5 volt, the resistance is about 1 kΩ, which means the resistive memory has become conductive.

In other words, as the predetermined pulse width is 100 ns and the predetermined voltage is between 3 volt and 5 volt, the resistive memory device indeed has great potential for MLC operation. The predetermined pulse width of 100 ns is a very small pulse width, and is operated with low voltage, so that the resistive memory device of the embodiment has the advantages of high-speed forming process and low forming voltage. The order of the resistive window of conventional memory devices is usually between 1 and 3. As shown in FIG. 29, the resistive memory device of the embodiment switched from insulating state to conductive state has a resistive window with order equal to or greater than 3. Thus, compared with the conventional memory devices, the resistive memory device of the embodiment is more suitable for being incorporated with other electronic components.

Figure 30:
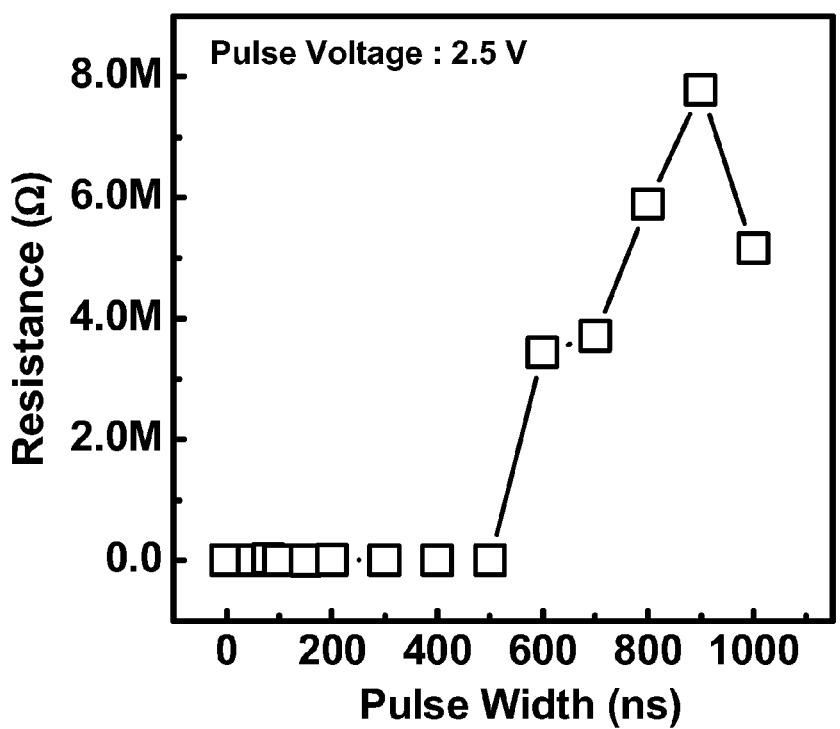
FIG. 30 is a diagram showing another pulse-voltage sweeping test result of the resistive memory device of the second embodiment.

FIG. 30 is a diagram showing another pulse-voltage sweeping test result of the resistive memory device of the second embodiment. The predetermined condition in the test is that the predetermined voltage (pulse voltage) is 2.5 volt, and the pulse voltage starts from 0 ns. The current of the resistive memory device with 0.25 volt is also read so as to calculate the corresponding resistance. In the initial of the test, the resistive memory device has a very low resistance and is similar to a conductor. As the pulse width of the resistive memory device is adjusted to be greater than 500 ns, the resistance of the resistive memory device of the embodiment is gradually increased. Then, as the pulse width is about 900 ns, the resistance of the resistive memory device is about 8MΩ and similar to an insulator. The result shown in FIG. 29 also indicates that the resistive memory device of the embodiment has potential for MLC operation.

Figure 31:
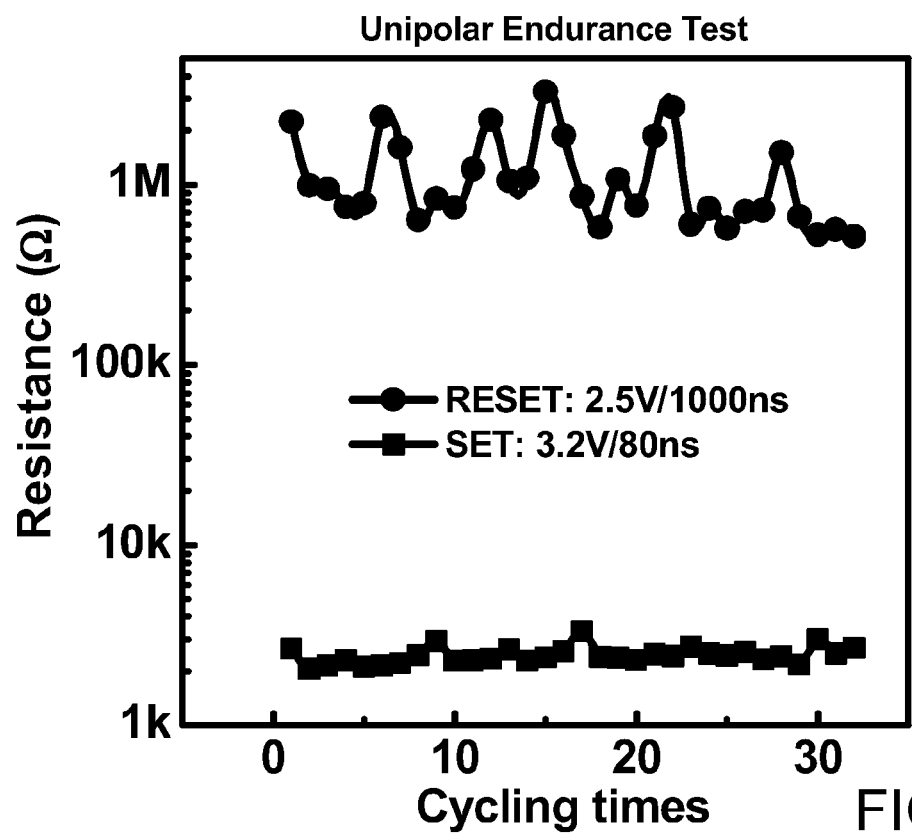
FIG. 31 is a diagram showing a unipolar endurance test result of the resistive memory device of the second embodiment.

FIG. 31 is a diagram showing a unipolar endurance test result of the resistive memory device of the second embodiment. In the test, the pulse voltage and pulse width of the set state are 3.2 volt and 80 ns, respectively, and the pulse voltage and pulse width of the reset state are 2.5 volt and 1000 ns, respectively. The resistance of the resistive memory device at each cycling times is recorded. As shown in FIG. 31, as the resistive memory device is tested for unipolar operation with low voltage, the resistances of the resistive memory device at all the cycling times are very stable, and the order of the resistive window is about 3.

Figure 32:
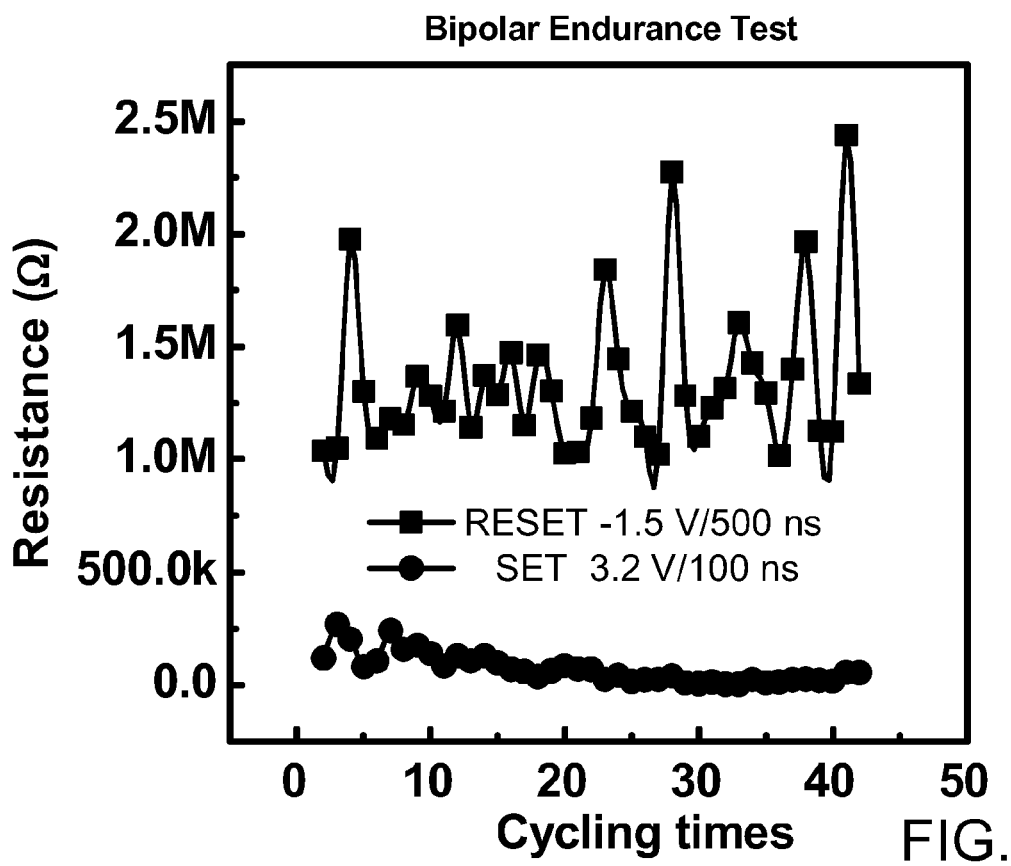
FIG. 32 is a diagram showing a bipolar endurance test result of the resistive memory device of the second embodiment.

FIG. 32 is a diagram showing a bipolar endurance test result of the resistive memory device of the second embodiment. In the test, the pulse voltage and pulse width of the set state are 3.2 volt and 100 ns, respectively, and the pulse voltage and pulse width of the reset state are −1.5 volt and 500 ns, respectively. The resistance of the resistive memory device at each cycling times is recorded. As shown in FIG. 32, as the resistive memory device is tested for bipolar operation with low voltage, the resistances of the resistive memory device at all the cycling times are also very stable, and the order of the resistive window is about 3.

Figure 33:
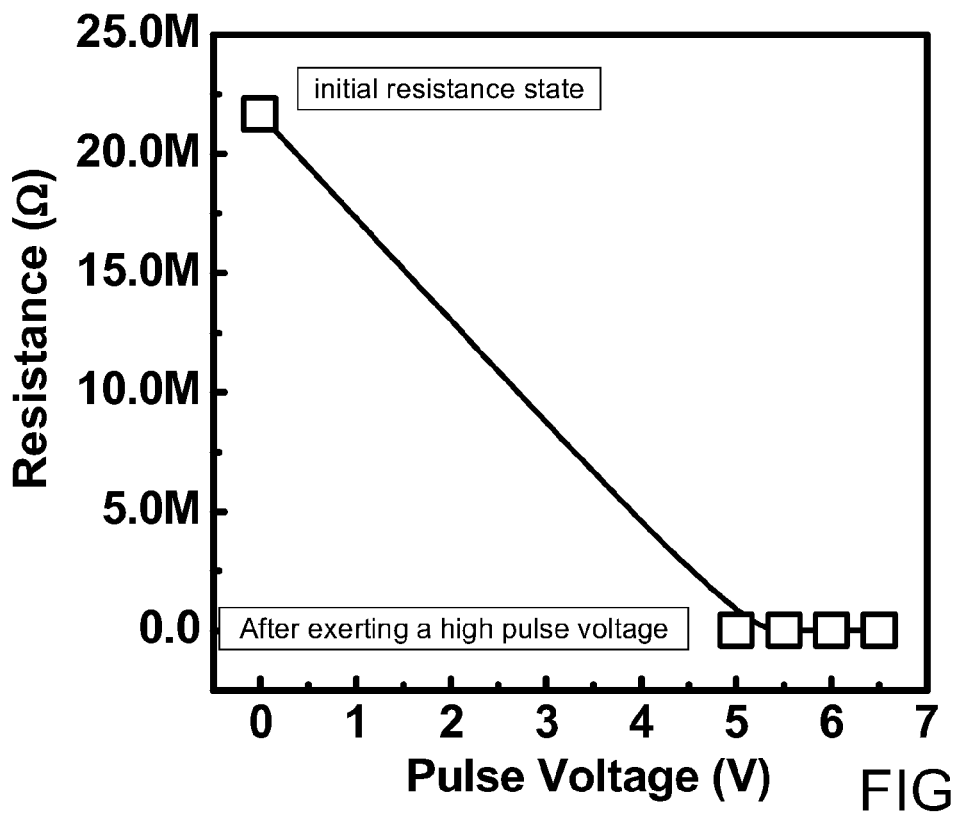
FIG. 33 is a diagram showing a test result when the resistive memory device of the second embodiment is provided with voltage not less than 5 volt.

Because of using tungsten silicide, the resistive memory device of the embodiment is suitable for not only MLC operation but also anti-fuse memory area. FIG. 33 is a diagram showing a test result when the resistive memory device of the second embodiment is provided with voltage not less than 5 volt. In the test, the pulse width is about 100 ns. As shown in FIG. 33, as directly applied the pulse voltage of 5 volt, the resistive memory device is immediately switched from initial insulating state (the resistance is about 21MΩ) to conductive state (the resistance is about 2 kΩ). As the applied voltage is increased, the resistance of the resistive memory device remains low and unchanged.

Figure 34:
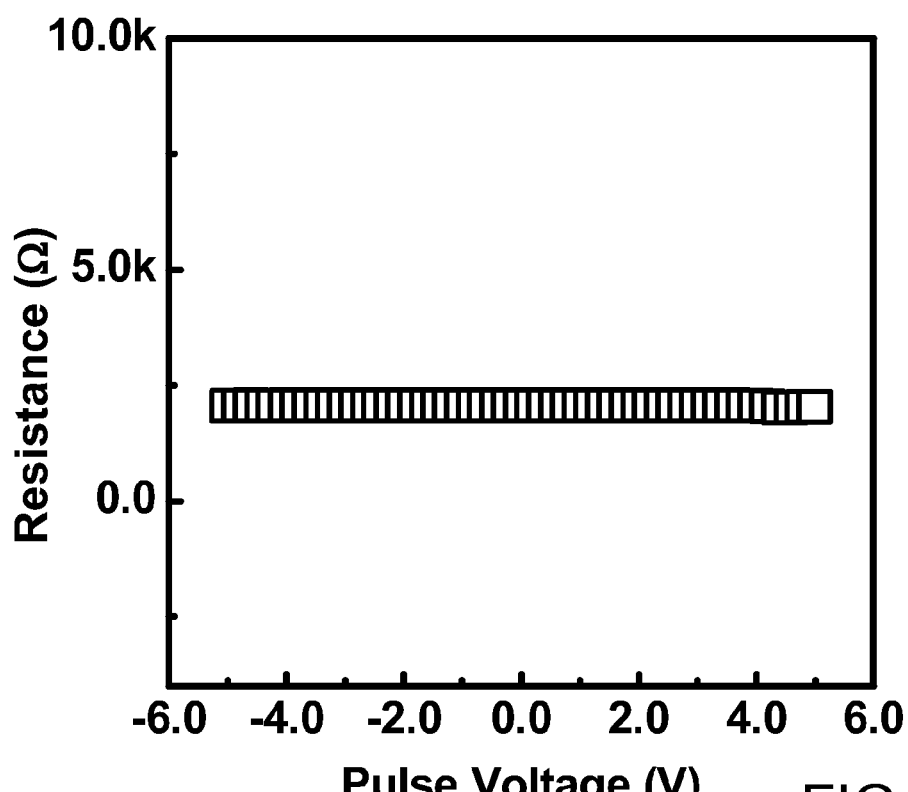
FIGS. 34 to 36 are diagrams showing different test results of the resistive memory device for anti-fuse memory application.
Figure 35:
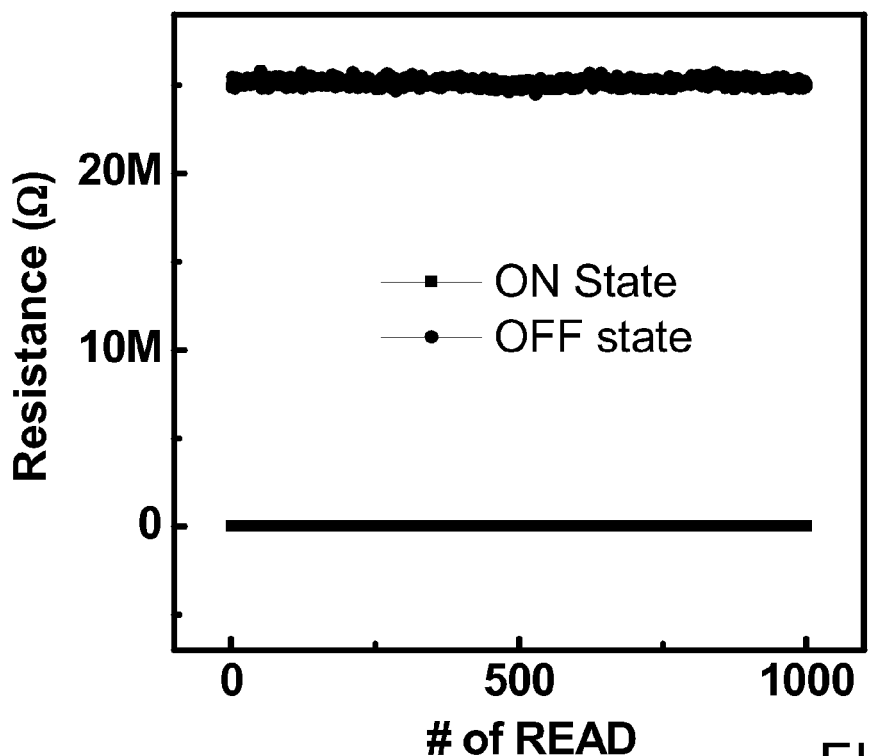
Figure 36:
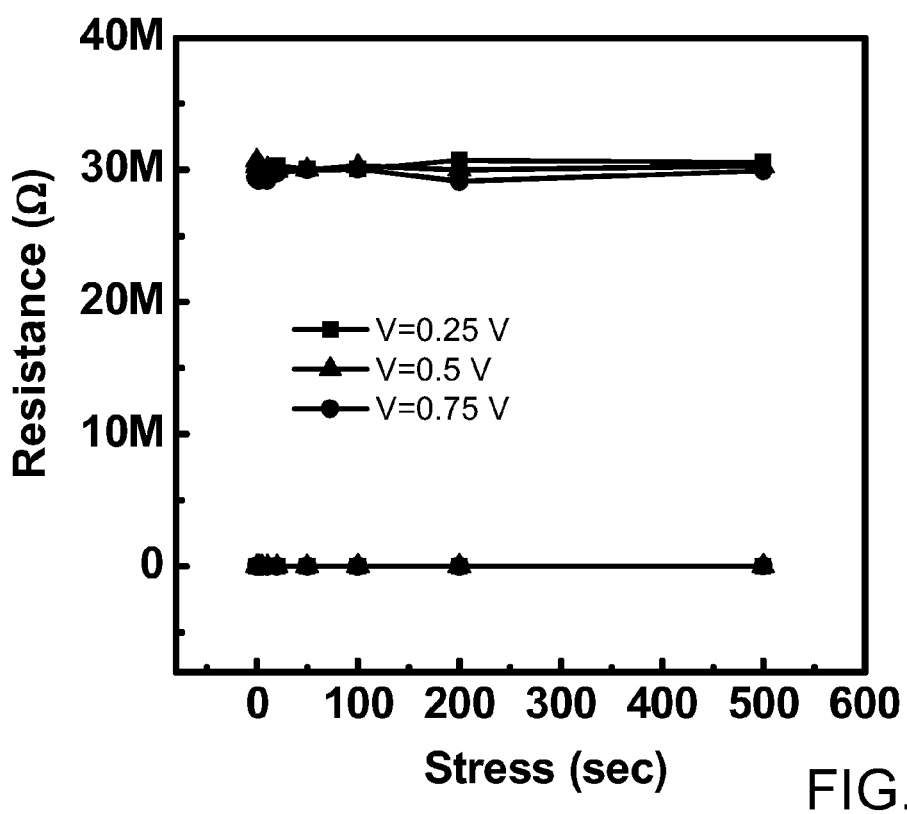

FIGS. 34 to 36 are diagrams showing different test results of the resistive memory device for anti-fuse memory application. In the test corresponding to FIG. 34, the resistive memory device is programmed to set (on) state. The pulse voltage starting from −5 volt to 5 volt with pulse width of 100 ns is gradually applied to the resistive memory device so as to measure the resistance of the resistive memory device with 0.25 volt. As shown in FIG. 34, the resistive memory device is capable of preventing the disturbance during the operation.

In the test corresponding to FIG. 35, the resistances of the resistive memory device at on and off states corresponding to 0.25 volt are measured and recorded, wherein the horizontal axis in FIG. 35 is the number of read. As shown in FIG. 35, the resistive memory device remains stable no matter at on or off state.

In the test corresponding to FIG. 36, the resistances of the resistive memory device are measured according to fixed time intervals. The resistances with 0.25, 0.5 and 0.75 volt of the resistive memory device at on and off states are measured during a time period from 0 to 500 second. As shown in FIG. 36, the resistive memory device with different voltage remains stable. The resistive memory device of the embodiment indeed possesses excellent characteristics for anti-fuse memory application.

The resistive memory device, the manufacturing method thereof and the operating method thereof disclosed above use different line-type patterns in the process to form self-align holes and define the position and size of the individual memory cells. The self-align openings are located at the intersection of the first signal lines and the second signal lines, and enable the memory cells to be coupled to the signal lines, eliminating the use of conventional via hole or contact hole formed in BEOL. The resistive memory device and its manufacturing method can further be incorporated with other process, such as double patterning lithography for enhancing the scaling characteristic of resistive memory device, and thus can be widely applied to other manufacturing area of memory device for manufacturing a resistive memory device with higher density of memory cells.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of manufacturing resistive memory device, comprising:
    forming a first implanted stacked structure in a substrate, wherein the first implanted stacked structure has a first impurity diffusion layer, a second impurity diffusion layer, and a third impurity diffusion layer;
    etching at least the first implanted stacked structure to form a plurality of second implanted stacked structures, wherein the first impurity diffusion layers of the second implanted stacked structures are first signal lines;
    forming a plurality of first insulating layers between the second implanted stacked structures;
    etching the second implanted stacked structures to form a plurality of third implanted stacked structures that are arranged in the form of a matrix, wherein the first signal lines are not etched;
    forming a plurality of second insulating layers between the third implanted stacked structures;
    forming a plurality of memory material layers in accordance with the third implanted stacked structures and electrically coupled to the third impurity diffusion layers;
    forming a patterned photo-resist layer on the first insulating layers, the second insulating layers and the memory material layers, wherein the patterned photo-resist layer exposes some of the memory material layers;
    etching the exposed memory material layers; and
    after the step of forming the patterned photo-resist layer and the step of etching the exposed memory material layers, forming a plurality of second signal lines perpendicular to the first signal lines and electrically coupled to the memory material layers.

2. The method according to claim 1, before the step of etching at least the first implanted stacked structure, further comprising:
    forming a tungsten silicide (WSix) layer over the third impurity diffusion layer.

3. The method according to claim 2, wherein the WSix layer is etched along with the first implanted stacked structure so as to form a plurality of strip-shaped WSix layers.

4. The method according to claim 3, wherein the strip-shaped WSix layers are etched along with the second implanted stacked structures so as to form a plurality of block-shaped WSix layers.

5. The method according to claim 4, wherein the block-shaped WSix layers are oxidized for forming the memory material layers.

6. The method according to claim 1, before the step of etching at least the first implanted stacked structure, further comprising:
    forming a poly-silicon layer over the third impurity diffusion layer.

7. The method according to claim 6, wherein the poly-silicon layer is etched along with the first implanted stacked structure so as to form a plurality of strip-shaped poly-silicon layers.

8. The method according to claim 7, wherein the strip-shaped poly-silicon layers are etched along with the second implanted stacked structures so as to form a plurality of block-shaped poly-silicon layers.

9. The method according to claim 8, wherein after the second insulating layers are formed, the block-shaped poly-silicon layers are removed for forming a plurality of openings used for receiving the memory material layers.

10. The method according to claim 1, wherein the step of forming the first implanted stacked structure comprises:
    sequentially forming the first impurity diffusion layer, the second impurity diffusion layer and the third impurity diffusion layer at different depths within the substrate by ion implantation.

11. The method according to claim 1, wherein the step of etching the first implanted stacked structure to form the second implanted stacked structures comprises:
    forming a hard mask material layer on the first implanted stacked structure;
    forming a photo-resist material layer on the hard mask material layer;
    forming an another patterned photo-resist layer from the photo-resist material layer;
    etching the hard mask material layer to form a patterned hard mask having a first line-type pattern;
    removing the another patterned photo-resist layer;
    etching a part of the first implanted stacked structure that is not covered by the patterned hard mask; and
    removing the patterned hard mask.

12. The method according to claim 1, wherein the step of etching the first implanted stacked structure to form the second implanted stacked structures comprises the process of double patterning lithography.

13. The method according to claim 1, wherein the step of forming the first insulating layers between the second implanted stacked structures comprises:
    depositing an insulating material on the substrate and within a plurality of gaps between the second implanted stacked structures; and
    smoothing the insulating material to form the first insulating layers.

14. The method according to claim 1, wherein the step of etching the second implanted stacked structures to form the third implanted stacked structures comprises:
    forming a hard mask material layer on the second implanted stacked structures;
    forming a photo-resist material layer on the hard mask material layer;
    forming an another patterned photo-resist layer from the photo-resist material layer;
    etching the hard mask material layer to form a patterned hard mask having a second line-type pattern;
    removing the another patterned photo-resist layer;
    etching a part of the second implanted stacked structures that are not covered by the patterned hard mask; and
    removing the patterned hard mask.

15. The method according to claim 1, wherein the step of etching the second implanted stacked structures to form the third implanted stacked structures comprises the process of double patterning lithography.

16. The method according to claim 1, wherein the step of forming the second insulating layers between the third implanted stacked structures comprises:
    depositing an insulating material on the substrate and within a plurality of gaps between the third implanted stacked structures; and
    smoothing the insulating material to form the second insulating layers.

17. The method according to claim 1, wherein the step of forming the memory material layers comprises:
    depositing an electrode material on the third implanted stacked structures;
    smoothing the electrode material to form a plurality of electrode structures on the third implanted stacked structures; and
    forming the memory material layers on surfaces of the electrode structures.

18. The method according to claim 17, wherein before the step of forming the memory material layers on the surfaces of the electrode structures, the step of forming the memory material layers comprises:

shortening the height of the first insulating layers and the second insulating layers for forming a plurality of protruding structures of the electrode structures.

19. The method according to claim 17, wherein the step of forming the memory material layers on the surfaces of the electrode structures comprises:

oxidizing the surfaces of the electrode structures.

20. The method according to claim 17, wherein the step of forming the memory material layers on the surfaces of the electrode structures comprises:

depositing a memory material on the surfaces of the electrode structures.

21. The method according to claim 1, wherein the step of forming the second signal lines comprises:

forming a conductive material layer on the first insulating layers, the second insulating layers and the memory material layers;

forming an another patterned photo-resist layer on the conductive material layer;

etching a part of the conductive material layer that is not covered by the another patterned photo-resist layer; and removing the another patterned photo-resist layer.

22. The method according to claim 1, before the step of forming the memory material layers, further comprising:

reducing each active area of the third impurity diffusion layers.

23. The method according to claim 22, wherein the step of reducing the active area of each third impurity diffusion layer comprises:

depositing a spacer material on the first insulating layers, the second insulating layers and the third impurity diffusion layers; and etching the spacer material to form a plurality of spacer layers, wherein the spacer layers expose partial surface of each third impurity diffusion layer.

24. A method of manufacturing resistive memory device, comprising:

forming a first implanted stacked structure in a substrate, wherein the first implanted stacked structure has a first impurity diffusion layer, a second impurity diffusion layer, and a third impurity diffusion layer;

forming a poly-silicon layer over the third impurity diffusion layer;

after the step of forming the poly-silicon layer, etching the poly-silicon layer so as to form a plurality of strip-shaped poly-silicon layers and etching at least the first implanted stacked structure along with the poly-silicon layer to form a plurality of second implanted stacked structures, wherein the first impurity diffusion layers of the second implanted stacked structures are first signal lines;

forming a plurality of first insulating layers between the second implanted stacked structures;

etching the plurality of strip-shaped poly-silicon layers so as to form a plurality of block-shaped poly-silicon layers and etching the second implanted stacked structures along with the plurality of strip-shaped poly-silicon layers to form a plurality of third implanted stacked structures that are arranged in the form of a matrix, wherein the first signal lines are not etched;

forming a plurality of second insulating layers between the third implanted stacked structures;

after the step of forming the plurality of second insulating layers, removing the plurality of block-shaped poly-silicon layers for forming a plurality of openings;

forming a plurality of memory material layers in accordance with the third implanted stacked structures and electrically coupled to the third impurity diffusion layers, wherein the plurality of openings formed in the step of removing the plurality of block-shaped poly-silicon layers is used for receiving the plurality of memory material layers; and forming a plurality of second signal lines perpendicular to the first signal lines and electrically coupled to the memory material layers.

25. A method of manufacturing resistive memory device, comprising:

forming a first implanted stacked structure in a substrate, wherein the first implanted stacked structure has a first impurity diffusion layer, a second impurity diffusion layer, and a third impurity diffusion layer;

etching at least the first implanted stacked structure to form a plurality of second implanted stacked structures, wherein the first impurity diffusion layers of the second implanted stacked structures are first signal lines;

forming a plurality of first insulating layers between the second implanted stacked structures;

etching the second implanted stacked structures to form a plurality of third implanted stacked structures that are arranged in the form of a matrix, wherein the first signal lines are not etched;

forming a plurality of second insulating layers between the third implanted stacked structures;

reducing each active area of the third impurity diffusion layers;

after the step of reducing the each active area of the third impurity diffusion layers, forming a plurality of memory material layers in accordance with the third implanted stacked structures and electrically coupled to the third impurity diffusion layers; and forming a plurality of second signal lines perpendicular to the first signal lines and electrically coupled to the memory material layers.

* * * * *